(12) United States Patent
Tsunekawa et al.

(10) Patent No.: US 10,636,634 B2
(45) Date of Patent: Apr. 28, 2020

(54) SPUTTERING APPARATUS, FILM DEPOSITION METHOD, AND CONTROL DEVICE

(71) Applicant: CANON ANELVA CORPORATION, Kawasaki-shi (JP)

(72) Inventors: Koji Tsunekawa, Kawasaki (JP); Masahiro Suenaga, Kawasaki (JP); Takeo Konno, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 85 days.

(21) Appl. No.: 15/971,479

(22) Filed: May 4, 2018

(65) Prior Publication Data

US 2018/0254172 A1   Sep. 6, 2018

Related U.S. Application Data

(60) Division of application No. 14/948,481, filed on Nov. 23, 2015, now Pat. No. 9,991,102, which is a division (Continued)

(30) Foreign Application Priority Data

Jun. 25, 2010 (JP) ................................. 2010-144847

(51) Int. Cl.
*H01J 37/34* (2006.01)
*C23C 14/34* (2006.01)
(Continued)

(52) U.S. Cl.
CPC ...... *H01J 37/3476* (2013.01); *C23C 14/3464* (2013.01); *C23C 14/505* (2013.01); (Continued)

(58) Field of Classification Search
CPC ...... C23C 14/54; C23C 14/505; C23C 14/542
See application file for complete search history.

(56) References Cited

U.S. PATENT DOCUMENTS 5,877,087 A   3/1999   Mosely et al.
6,046,097 A   4/2000   Hsieh et al.
(Continued)

FOREIGN PATENT DOCUMENTS

JP   7-292475 A   11/1995
JP   2000-265263 A   9/2000
(Continued)

OTHER PUBLICATIONS

International Search Report in PCT/JP2011/060924, dated Aug. 9, 2011, with English translation (8 pages).
(Continued)

*Primary Examiner* — John J Brayton
(74) *Attorney, Agent, or Firm* — Venable LLP

(57) ABSTRACT

A sputtering apparatus according to one embodiment of the present invention includes a substrate holder, a cathode unit arranged at a position diagonally opposite to the substrate holder, a position sensor for detecting a rotational position of the substrate, and a holder rotation controller for adjusting a rotation speed of the substrate according to the detected rotational position. The holder rotation controller controls the rotation speed so that the rotation speed of the substrate when the cathode unit is located on a side in a first direction as an extending direction of a process target surface of the relief structure is lower than the rotation speed of the substrate when the cathode unit is located on a side in a second direction which is perpendicular to the first direction along the rotation of the substrate.

3 Claims, 18 Drawing Sheets

Related U.S. Application Data of application No. 13/710,696, filed on Dec. 11, 2012, now abandoned, which is a continuation of application No. PCT/JP2011/060924, filed on May 12, 2011.

(51) Int. Cl.

| | | |
|---|---|---|
| *C23C 14/50* | (2006.01) | |
| *C23C 14/54* | (2006.01) | |
| *G11B 5/39* | (2006.01) | |
| *H01J 37/32* | (2006.01) | |

(52) U.S. Cl.
CPC ............ *C23C 14/54* (2013.01); *C23C 14/542* (2013.01); *G11B 5/3909* (2013.01); *H01J 37/32733* (2013.01); *H01J 37/34* (2013.01); *H01J 37/3429* (2013.01); *H01J 37/3435* (2013.01); *H01J 37/3473* (2013.01); *G11B 5/3906* (2013.01); *H01J 2237/20214* (2013.01); *H01J 2237/24578* (2013.01); *H01J 2237/332* (2013.01)

(56) References Cited

U.S. PATENT DOCUMENTS

| | | | |
|---|---|---|---|
| 6,699,783 | B2 | 3/2004 | Raaijmakers et al. |
| 6,716,322 | B1 | 4/2004 | Hedge et al. |
| 6,800,183 | B2 | 10/2004 | Takahashi |
| 8,118,981 | B2 | 2/2012 | Tsunekawa |
| 8,377,270 | B2 | 2/2013 | Tsunekawa |
| 8,877,019 | B2 | 11/2014 | Ernult |
| 2004/0050687 | A1 | 3/2004 | Lee et al. |
| 2009/0095617 | A1 | 4/2009 | Lee et al. |
| 2009/0211897 | A1 | 8/2009 | Tsunekawa |
| 2010/0072061 | A1 | 3/2010 | Morohashi |
| 2010/0155227 | A1 | 6/2010 | Endo et al. |
| 2010/0213047 | A1 | 8/2010 | Nagamine et al. |
| 2010/0258432 | A1 | 10/2010 | Emult |
| 2011/0042209 | A1 | 2/2011 | Yamaguchi et al. |
| 2011/0223346 | A1 | 9/2011 | Kitada et al. |
| 2011/0253037 | A1 | 10/2011 | Tsunekawa et al. |
| 2012/0193071 | A1 | 8/2012 | Tsunekawa et al. |
| 2013/0134032 | A1 | 5/2013 | Tsunekawa et al. |
| 2014/0183035 | A1 | 7/2014 | Morohashi |

FOREIGN PATENT DOCUMENTS

| | | |
|---|---|---|
| JP | 2004-107688 A | 4/2004 |
| JP | 2004-232006 A | 8/2004 |
| JP | 2009-041040 A | 2/2009 |
| KR | 2003-0038384 A | 5/2003 |
| WO | 2008/149635 A1 | 12/2008 |
| WO | 2009/081953 A1 | 7/2009 |
| WO | 2010/038421 A1 | 4/2010 |

OTHER PUBLICATIONS

Office Action issued in Korean Patent Application No. 10-2013-7001793, dated Jun. 2, 2014 (15 pages).

International Preliminary Report on Patentability in PCT/JP2011/060924, dated Jan. 24, 2013, with English translation of the Written opinion (12 pages).

European Search Report issued in European Application No. 11797923.7 dated Dec. 22, 2015 (11 pages).

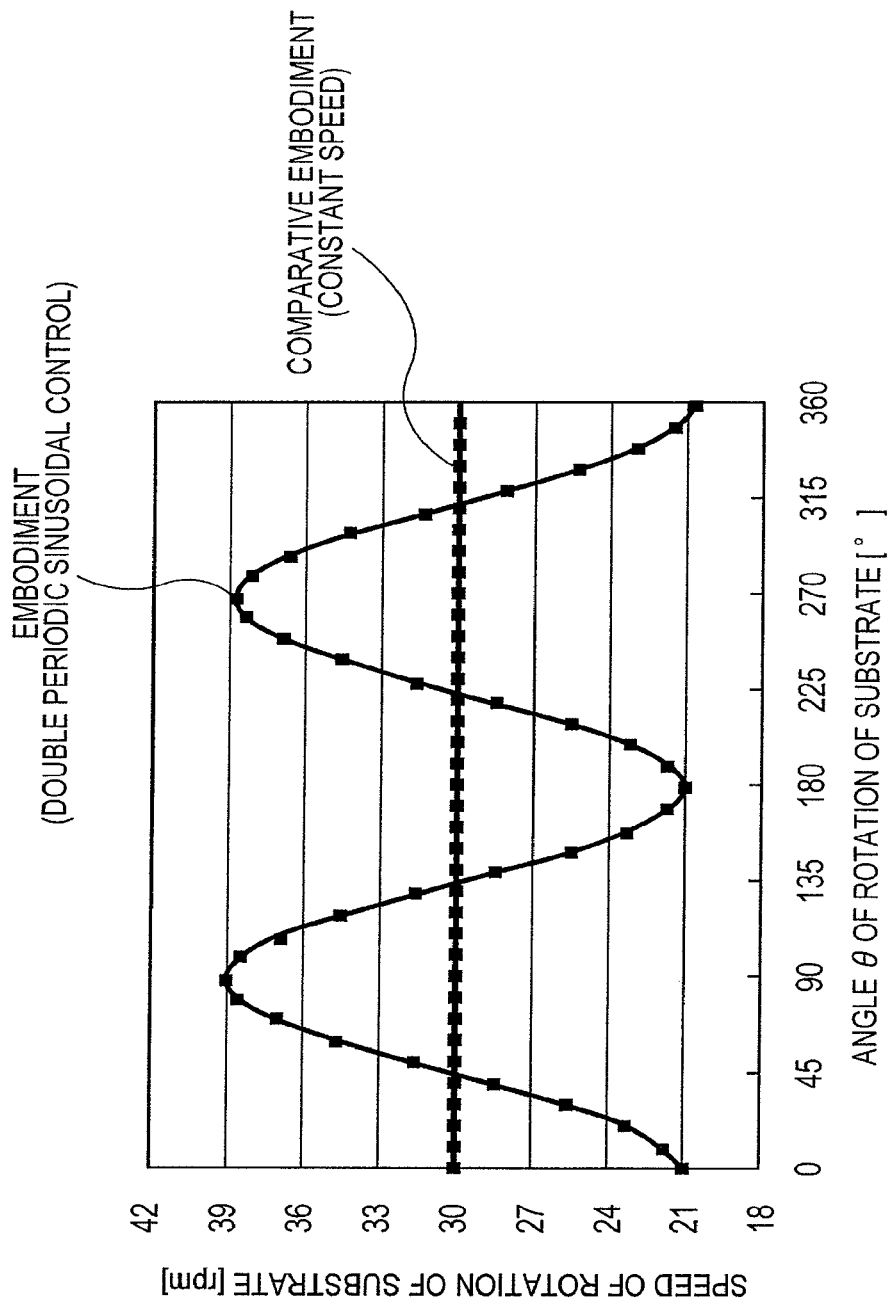

ENLARGED VIEW

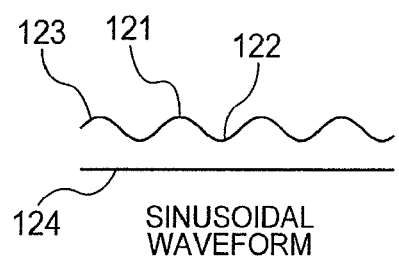
FIG. 11A  SINUSOIDAL WAVEFORM
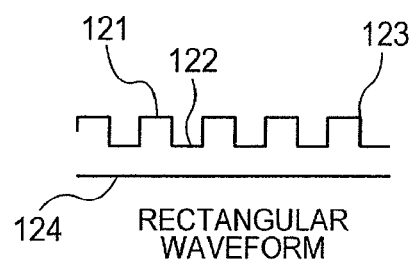
FIG. 11B  RECTANGULAR WAVEFORM
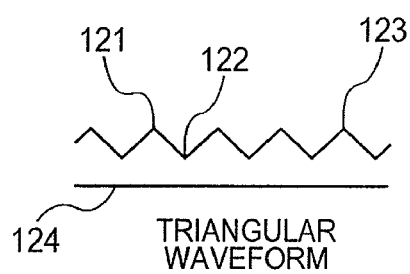
FIG. 11C  TRIANGULAR WAVEFORM
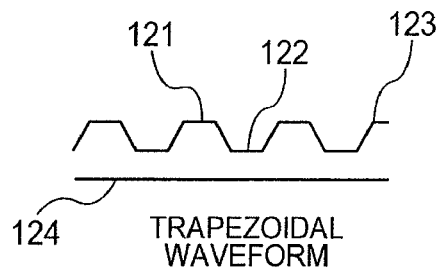
FIG. 11D  TRAPEZOIDAL WAVEFORM

SPUTTERING APPARATUS, FILM DEPOSITION METHOD, AND CONTROL DEVICE

CROSS-REFERENCES TO RELATED APPLICATIONS

This application is a divisional of U.S. patent application Ser. No. 14/948,481 filed Nov. 23, 2015, which is a divisional of U.S. patent application Ser. No. 13/710,696, filed Dec. 11, 2012, which is a continuation application of International Application No. PCT/JP2011/060924, filed May 12, 2011, which claims the benefit of Japanese Patent Application No. 2010-144847, filed Jun. 25, 2010. The contents of the aforementioned applications are incorporated herein by reference in their entireties.

TECHNICAL FIELD

The present invention relates to a sputtering apparatus, a film deposition method and a control device for depositing a thin film on a substrate having a surface relief structure (hereinafter called relief structure) in a manufacturing process for a semiconductor device, an electronic device, a magnetic device, a display device or the like.

BACKGROUND ART

Methods using a chemical reaction on a substrate, such as chemical vapor deposition method (refer to PTL 1) and atomic layer deposition method (refer to PTL 2), are well known as methods for uniformly depositing a thin film on a substrate having a relief structure. These methods are used for coating of a bottom surface and an inner wall surface of a deeply bottomed trench or hole. However, the methods using the chemical reaction are not suitable for applications requiring a metal film of high purity, due to the fact that a reactive gas in the course of processing gets mixed in the film. Further, only very limited materials have so far been put into use for metal films because development time is required to search for a source gas as a source of the chemical reaction. Therefore, the methods are not used for purposes of deposition of multilayered films of various kinds of metal films or alloy films.

Remote low-pressure sputtering (refer to PTL 3), bias sputtering (refer to PTL 4) and the like are known as conventional technologies for the coating of the bottom surface and the inner wall surface of the trench or the hole by physical vapor deposition method. However, the remote low-pressure sputtering and the bias sputtering inherently have the problem of involving poor uniformity in film thickness in a substrate surface, because a target surface is arranged substantially parallel to and opposite to the substrate surface.

Also known is an example of sputtering method in which coating properties on the bottom surface and the inner wall surface of the hole are improved by depositing a film while appropriately varying the angle of the substrate being rotated (refer to PTL 5), which, however, is inadequate for an improvement in film thickness distribution in the substrate surface. For a method for improving the film thickness distribution as well as improving the coating properties by appropriately varying the angle of the substrate being rotated, a mask called a shaper needs to be provided immediately above the substrate to control the amount of incident sputter particles, as illustrated in an example of ion beam sputter deposition method disclosed in PTL 6. However, the use of the mask poses the problem of particle generation from a film peeling off from the mask because the film is deposited on the mask with time.

Meanwhile, a deposition method with oblique incidence and rotation disclosed in PTL 7 is known as a method for uniformly depositing a thin film on a flat surface.

In this method, a cathode unit supporting a target is arranged offset from a substrate, i.e., obliquely above the substrate, and a target material is sputtered by magnetron sputtering while the substrate is rotated along its process target surface.

Further, as for the deposition method with oblique incidence and rotation, there is disclosed a method for controlling the rotation speed of a substrate in order to reduce unevenness in film thickness distribution of a magnetic film formed in a magnetic field (refer to PTL 8).

CITATION LIST

Patent Literature

PTL 1: U.S. Pat. No. 5,877,087
PTL 2: U.S. Pat. No. 6,699,783
PTL 3: Japanese Patent Application Publication No. 7-292475
PTL 4: Japanese Patent Application Publication No. 2004-107688
PTL 5: Japanese Patent Application Publication No. 2009-41040
PTL 6: U.S. Pat. No. 6,716,322
PTL 7: Japanese Patent Application Publication No. 2000-265263
PTL 8: International Patent Application Publication No. WO2010/038421

SUMMARY OF INVENTION

When a film is deposited in a relief structure on a substrate by the conventional deposition method with oblique incidence and rotation, there arises a problem that the film thickness of a thin film deposited on wall surface or sloped surface portions (hereinafter called side surfaces) of a land or groove varies in the substrate surface. More specifically, there arises a problem that the relative positions of the substrate and the target arranged obliquely above the substrate cause variation in film thickness of a film deposited between a side surface facing toward the outside of the substrate (hereinafter also called a first surface) and a side surface facing toward the center of the substrate (hereinafter also called a second surface).

In other words, the deposition method with oblique incidence and rotation is effective technology for a flat substrate having no relief structure on the surface. However, when the deposition method with oblique incidence and rotation is applied to sputtering on a substrate having a relief structure such as a mesa structure, a V-groove or a trench, the thickness of a film deposited by sputtering varies between two certain surfaces of the relief structure (particularly, process target surfaces by sputtering (e.g. two surfaces extending in the longitudinal direction of the relief structure while being opposed to each other)).

Specific description will be given using FIGS. 2, 18 and 19. FIG. 2 illustrates a state where so-called mesa structures 211 having rectangular bottom and top surfaces are formed as relief structures on a process target surface of a substrate 21. In each of the mesa structures 211, a first surface facing toward the outside of the substrate is indicated by reference numeral 211a, and a second surface facing toward the center of the substrate is indicated by reference numeral 211b. Focusing on a certain relief structure on the substrate, FIGS. 18 and 19 illustrate the relative positions of the relief structure and a target. FIG. 19 illustrates the substrate rotated 180° from the position in FIG. 18. In the position in FIG. 18, the surface 211a faces a target 400, and a film formed by sputtering is deposited mainly on the surface 211a. In the position in FIG. 19, the surface 211b faces the target 400, and a film formed by sputtering is deposited mainly on the surface 211b. At this time, it can be seen that a distance between the target 400 and the surface 211a in FIG. 18 is different from a distance between the target 400 and the surface 211b in FIG. 19. The longer the distance between the target and the process target surface, the smaller the amount of deposition. In the case of FIGS. 18 and 19, therefore, a film thickness on the surface 211a is greater than that on the surface 211b. Thus, even the relief structures formed on the substrate are same, the film thickness varies between its side surfaces according to the orientations of the side surfaces. This holds true for all the relief structures other than a relief structure located substantially on the center of the substrate.

It may be said that this tendency is also observed even if the target is arranged in any location, insofar as the target is arranged obliquely above (or arranged offset from) the substrate. Further, it may be said that the tendency is also observed even if the number of targets arranged obliquely above the substrate is more than one. The reason is that, even if targets are arranged at positions symmetrical with respect to a central axis of the substrate, there are no changes in the relative positions of the targets, the surface 211a and the surface 211b. In other words, for any target, the distance between the surface 211a and the target when facing each other is short, whereas the distance between the surface 211b and the target when facing each other is long.

In view of the above-described circumstances, an object of the present invention is therefore to provide a sputtering apparatus, a film deposition method, and a control device, which are capable of ensuring a uniform film thickness of films deposited on side surface portions of a relief structure, throughout the relief structure, even on a substrate on which the relief structure is formed.

In order to attain the above object, according to the present invention, there is provided a sputtering apparatus including: a substrate holder configured to rotatably hold a substrate; a target holder arranged at a position diagonally opposite to the substrate holder, and configured to support at least one sputtering target; a position detecting means for detecting a rotational position of the substrate held on the substrate holder; and a rotation control means for adjusting a rotation speed of the substrate according to the rotational position detected by the position detecting means, wherein, when the substrate having at least one relief structure formed thereon is placed on the substrate holder, the rotation control means controls the rotation speed of the substrate so that the rotation speed of the substrate when the sputtering target to be deposited is located on a side in a first direction which is parallel to a side surface as a process target surface of the relief structure and is parallel to an in-plane direction of the substrate is lower than the rotation speed of the substrate when the sputtering target to be deposited is located on a side in a second direction which is perpendicular to the first direction and is parallel to the in-plane direction of the substrate.

Also, according to the present invention, there is provided a sputtering apparatus including: a substrate holder configured to hold a substrate while discontinuously rotating the substrate; a target holder arranged at a position diagonally opposite to the substrate holder, and configured to support at least one sputtering target; a position detecting means for detecting a rotational position of the substrate held on the substrate holder; and a rotation control means for adjusting rotation stop time for the substrate according to the rotational position detected by the position detecting means, wherein, when the substrate having at least one relief structure formed thereon is placed on the substrate holder, the rotation control means controls the rotation stop time for the substrate so that the rotation stop time for the substrate when the sputtering target to be deposited is located on a side in a first direction which is parallel to a side surface as a process target surface of the relief structure and is parallel to an in-plane direction of the substrate is longer than the rotation stop time for the substrate when the sputtering target to be deposited is located on a side in a second direction which is perpendicular to the first direction and is parallel to the in-plane direction of the substrate.

Also, according to the present invention, there is provided a sputtering apparatus including: a substrate holder configured to rotatably hold a substrate; a cathode unit configured to sputter at least one sputtering target arranged at a position diagonally opposite to the substrate holder; a position detecting means for detecting a rotational position of the substrate held on the substrate holder; and a power control means for adjusting supply power for the cathode unit according to the rotational position detected by the position detecting means, wherein, when the substrate having at least one relief structure formed thereon is placed on the substrate holder, the power control means adjusts the supply power for the cathode unit so that the supply power for the cathode unit when the sputtering target to be deposited is located on a side in a first direction which is parallel to a side surface as a process target surface of the relief structure and is parallel to an in-plane direction of the substrate is greater than the supply power for the cathode unit when the sputtering target to be deposited is located on a side in a second direction which is perpendicular to the first direction and is parallel to the in-plane direction of the substrate.

Also, according to the present invention, there is provided a film deposition method using sputtering, including the steps of: placing a substrate having at least one relief structure formed thereon, on a rotatable substrate holder; and forming a film on a process target surface of the relief structure by sputtering a sputtering target arranged at a position diagonally opposite to the substrate, while rotating the substrate, wherein the step of forming includes forming the film so that the amount of deposition on a side surface as the process target surface is relatively large when the sputtering target to be deposited is located on a side in a first direction which is parallel to the side surface as the process target surface of the relief structure on the substrate and is parallel to an in-plane direction of the substrate, and so that the amount of deposition on the side surface as the process target surface is relatively small when the sputtering target to be deposited is located on a side in a second direction which is perpendicular to the first direction and is parallel to the in-plane direction of the substrate.

Also, according to the present invention, there is provided a film deposition method using sputtering, including the steps of: placing a substrate having at least one relief structure formed thereon, on a rotatable substrate holder; and forming a film on a process target surface of the relief structure by sputtering a sputtering target arranged at a position diagonally opposite to the substrate, while rotating the substrate, wherein the step of forming includes the steps of: detecting a rotational position of the substrate; and adjusting a rotation speed of the substrate according to the detected rotational position, and the step of adjusting includes controlling the rotation speed of the substrate so that the rotation speed of the substrate when the sputtering target to be deposited is located on a side in a first direction which is parallel to a side surface as the process target surface of the relief structure on the substrate and is parallel to an in-plane direction of the substrate is lower than the rotation speed of the substrate when the sputtering target to be deposited is located on a side in a second direction which is perpendicular to the first direction and is parallel to the in-plane direction of the substrate.

Also, according to the present invention, there is provided a film deposition method using sputtering, including the steps of: placing a substrate having at least one relief structure formed thereon, on a rotatable substrate holder; and forming a film on a process target surface of the relief structure by sputtering a sputtering target arranged at a position diagonally opposite to the substrate, while discontinuously rotating the substrate, wherein the step of forming includes the steps of: detecting a rotational position of the substrate; and adjusting rotation stop time for the substrate according to the detected rotational position, and the step of adjusting includes controlling the rotation stop time for the substrate so that the rotation stop time for the substrate when the sputtering target to be deposited is located on a side in a first direction which is parallel to a side surface as the process target surface of the relief structure on the substrate and is parallel to an in-plane direction of the substrate is longer than the rotation stop time for the substrate when the sputtering target to be deposited is located on a side in a second direction which is perpendicular to the first direction and is parallel to the in-plane direction of the substrate.

Also, according to the present invention, there is provided a film deposition method using sputtering, including the steps of: placing a substrate having at least one relief structure formed thereon, on a rotatable substrate holder; and forming a film on a process target surface of the relief structure by sputtering a sputtering target arranged at a position diagonally opposite to the substrate with plasma generated by supplying power to a cathode unit, while rotating the substrate, wherein the step of forming includes the steps of: detecting a rotational position of the substrate; and adjusting the power according to the detected rotational position, and the step of adjusting includes adjusting the supply power for the cathode unit so that the power supplied to the cathode unit when the sputtering target to be deposited is located on a side in a first direction which is parallel to a side surface as the process target surface of the relief structure on the substrate and is parallel to an in-plane direction of the substrate is greater than the power supplied to the cathode unit when the sputtering target to be deposited is located on a side in a second direction which is perpendicular to the first direction and is parallel to the in-plane direction of the substrate.

Also, according to the present invention, there is provided a control device for controlling a sputtering apparatus including a substrate holder configured to rotatably hold a substrate; a target holder arranged at a position diagonally opposite to the substrate holder, and configured to support at least one sputtering target; a position detecting means for detecting a rotational position of the substrate held on the substrate holder; and a rotation driving means for controlling rotation of the substrate holder, the control device including: means for acquiring information on the rotational position from the position detecting means; means for generating a control signal to control the rotation driving means according to the acquired information on the rotational position, when the substrate having at least one relief structure formed thereon is placed on the substrate holder, in such a manner that the rotation speed of the substrate when the sputtering target to be deposited is located on a side in a first direction which is parallel to a side surface as a process target surface of the relief structure and is parallel to an in-plane direction of the substrate is lower than the rotation speed of the substrate when the sputtering target to be deposited is located on a side in a second direction which is perpendicular to the first direction and is parallel to the in-plane direction of the substrate; and means for transmitting the generated control signal to the rotation driving means.

Also, according to the present invention, there is provided a control device for controlling a sputtering apparatus including a substrate holder configured to hold a substrate while discontinuously rotating the substrate; a target holder arranged at a position diagonally opposite to the substrate holder, and configured to support at least one sputtering target; a position detecting means for detecting a rotational position of the substrate held on the substrate holder; and a rotation driving means for adjusting rotation stop time for the substrate according to the rotational position detected by the position detecting means, the control device including: means for acquiring information on the rotational position from the position detecting means; means for generating a control signal to control the rotation stop time for the substrate according to the acquired information on the rotational position, when the substrate having at least one relief structure formed thereon is placed on the substrate holder, in such a manner that the rotation stop time for the substrate when the sputtering target to be deposited is located on a side in a first direction which is parallel to a side surface as a process target surface of the relief structure and is parallel to an in-plane direction of the substrate is longer than the rotation stop time for the substrate when the sputtering target to be deposited is located on a side in a second direction which is perpendicular to the first direction and is parallel to the in-plane direction of the substrate; and means for transmitting the generated control signal to the rotation driving means.

Further, according to the present invention, there is provided a control device for controlling a sputtering apparatus including a substrate holder configured to rotatably hold a substrate; a target holder arranged at a position diagonally opposite to the substrate holder, and configured to support at least one sputtering target; a position detecting means for detecting a rotational position of the substrate held on the substrate holder; and a power supply source configured to supply power to the cathode unit, the control device including: means for acquiring information on the rotational position from the sputtering apparatus; means for generating a control signal to control the supply power for the cathode unit according to the acquired information on the rotational position, when the substrate having at least one relief structure formed thereon is placed on the substrate holder, in such a manner that the supply power for the cathode unit when the sputtering target to be deposited is located on a side in a first direction which is parallel to a side surface as a process target surface of the relief structure and is parallel to an in-plane direction of the substrate is greater than the supply power for the cathode unit when the sputtering target to be deposited is located on a side in a second direction which is perpendicular to the first direction and is parallel to the in-plane direction of the substrate; and means for transmitting the generated control signal to the power supply source.

According to the present invention, even when relief structures are formed on a substrate in a configuration in which a target is arranged obliquely above the substrate, it is possible to reduce variations in film thickness between two surfaces of each of the relief structures, specifically two process target surfaces, opposite to each other (e.g. two side surfaces (i.e. sloped surfaces or wall surfaces) opposite to each other, formed along a longitudinal direction).

BRIEF DESCRIPTION OF DRAWINGS

FIG. 6 is an explanatory graph illustrating a control map of a rotation speed of the substrate holder in a sputtering method according to one embodiment of the present invention.

FIG. 11A is a view illustrating an example of a cross-sectional waveform of the wave-shaped relief structure according to one embodiment of the present invention.

FIG. 11B is a view illustrating an example of a cross-sectional waveform of the wave-shaped relief structure according to one embodiment of the present invention.

FIG. 11C is a view illustrating an example of a cross-sectional waveform of the wave-shaped relief structure according to one embodiment of the present invention.

FIG. 11D is a view illustrating an example of a cross-sectional waveform of the wave-shaped relief structure according to one embodiment of the present invention.

DESCRIPTION OF EMBODIMENTS

Figure 1:
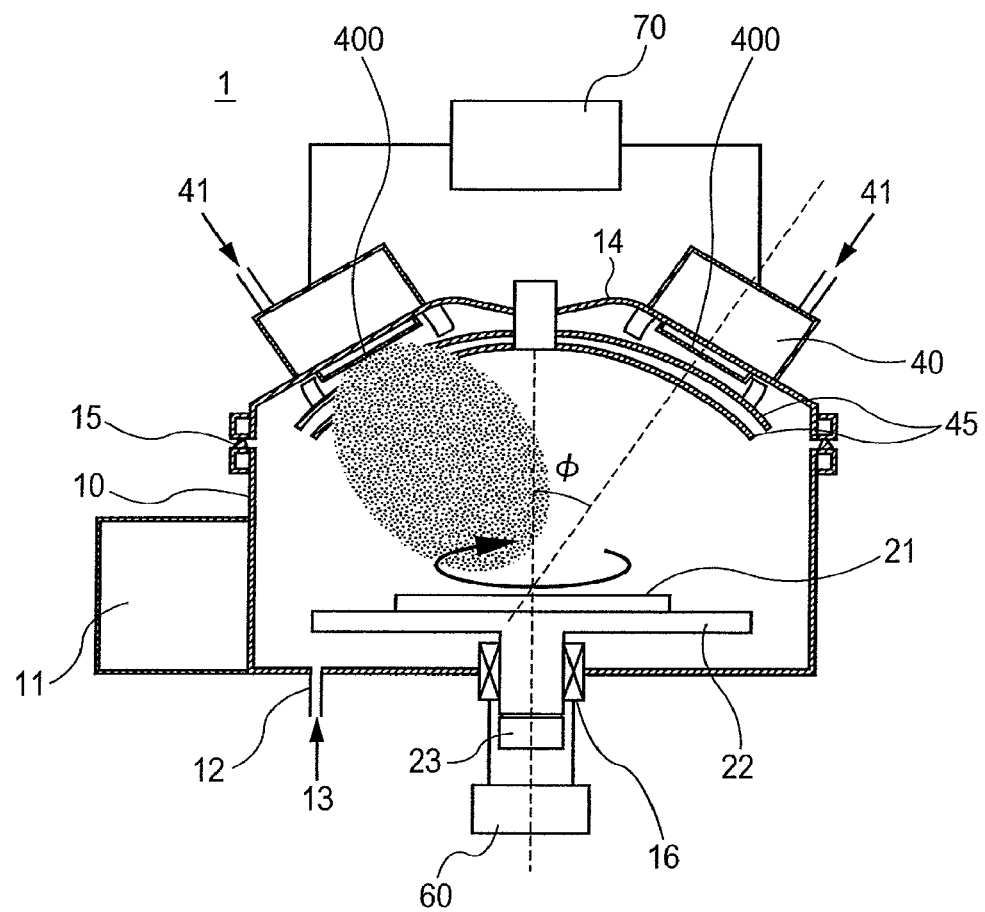
FIG. 1 is a schematic sectional view illustrating in diagrammatic form a sputtering apparatus according to one embodiment of the present invention.

Although embodiments of the present invention will be described below with reference to the drawings, it is to be understood that the present invention is not limited to the embodiments. Incidentally, in the drawings described below, parts having the same functions are indicated by the same reference numerals, and repeated description of the parts will sometimes be omitted.

First Embodiment

Figure 2:
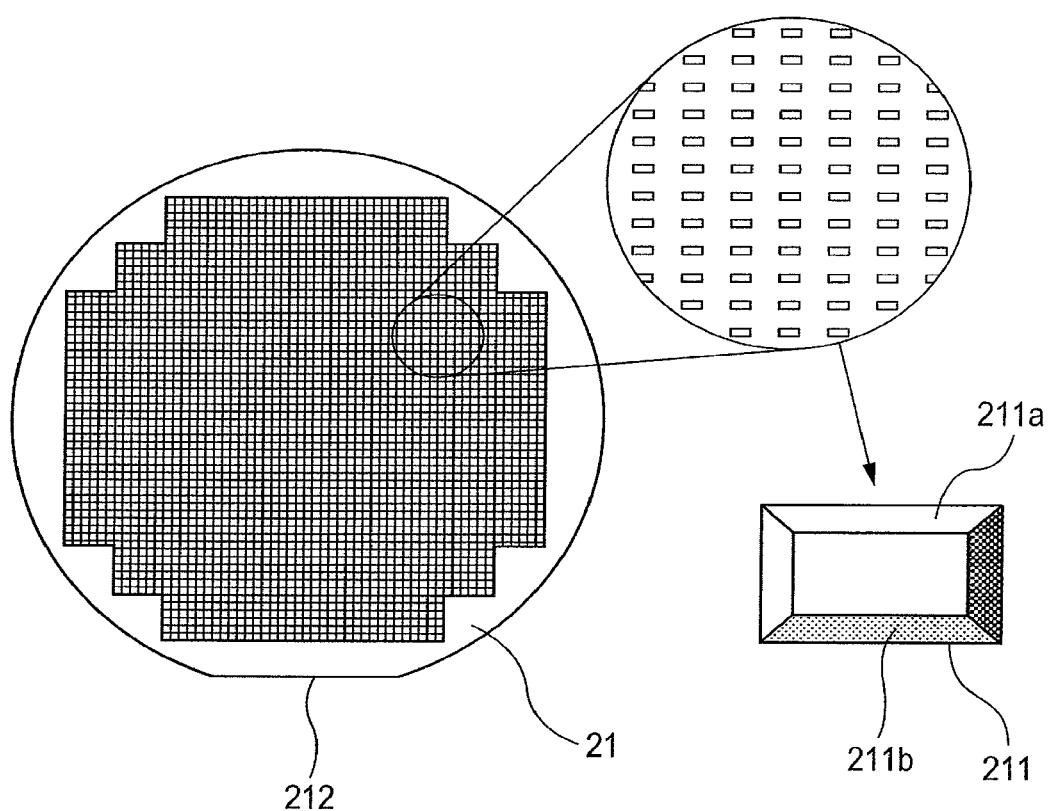
FIG. 2 is a view illustrating a state in which mesa structures are formed as relief structures on a substrate according to one embodiment of the present invention.
Figure 3:
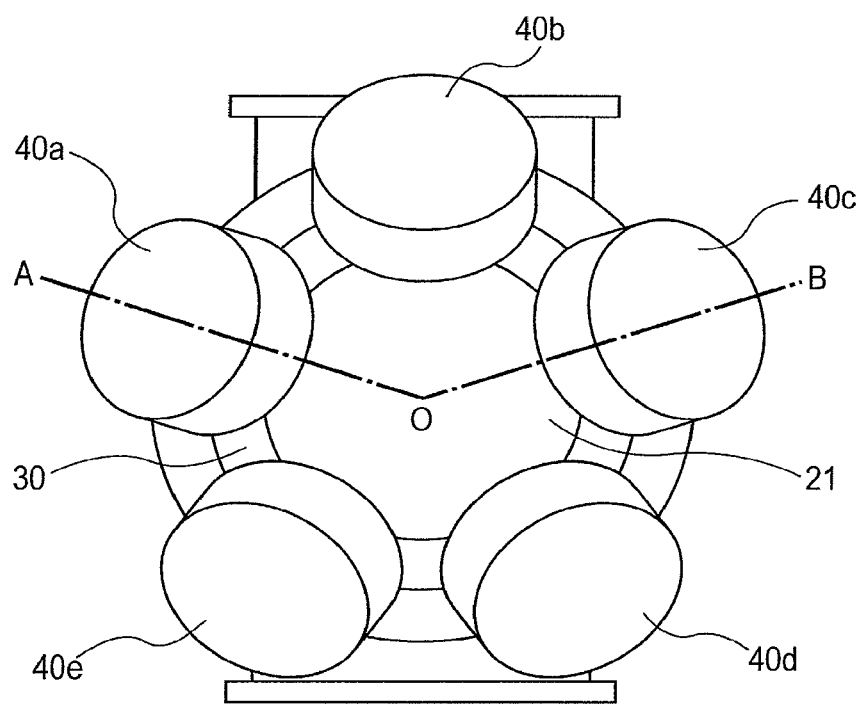
FIG. 3 is a plan view illustrating in diagrammatic form the relative dispositions of a substrate holder and cathode units according to one embodiment of the present invention.

A sputtering apparatus according to a first embodiment will be described with reference to FIGS. 1 to 3. FIG. 1 is a schematic sectional view illustrating in diagrammatic form the sputtering apparatus of the first embodiment. Also, FIG. 2 is a plan view illustrating in diagrammatic form an example of a substrate according to the first embodiment having relief structures integrated on a process target surface, and an enlarged view of the relief structure. Further, FIG. 3 is a plan view illustrating in diagrammatic form the relative dispositions of a substrate holder and cathode units. Here, FIG. 1 corresponds to a cross section taken along line A-O-B of FIG. 3.

As illustrated in FIG. 1, a sputtering apparatus 1 of the first embodiment includes a vacuum chamber 10 (hereinafter sometimes called merely a "chamber"), and the vacuum chamber 10 is provided with an upper lid 14 through an O-ring 15 for vacuum seal. The vacuum chamber 10 is provided with a vacuum pump 11 for evacuation of the vacuum chamber 10. The vacuum chamber 10 is connected to an adjacent vacuum transfer chamber (unillustrated) via a gate valve (unillustrated) for bringing in a substrate 21 to be processed.

The chamber 10 is provided with an opening as a gas injection port 12, and a gas introduction system 13 for introducing a reactive sputtering gas into the chamber 10 is connected to the gas injection port 12. A gas cylinder (unillustrated) is connected to the gas introduction system 13 via an automatic flow rate controller (unillustrated) such for example as a mass flow controller, and the reactive gas is introduced through the gas injection port 12 at a predetermined flow rate. For reactive sputtering in the chamber 10, the gas introduction system 13 feeds the reactive gas into the chamber 10.

A lower portion of processing space in the chamber 10 is provided with a substrate holder 22 capable of supporting the substrate 21 on its top surface. The substrate 21 as a processing object is typically carried onto the substrate holder 22 through the gate valve (unillustrated) by a handling robot included in the adjacent vacuum transfer chamber (unillustrated). The substrate holder 22 is a disc-shaped pedestal (or stage), and, for example, is configured to attractively support the substrate 21 on the top surface by electrostatic attraction. The substrate holder 22 is connected to a rotation driving mechanism 60 via a rotary motion feedthrough 16 for vacuum, and is configured to be rotatable around its central axis while maintaining vacuum. Therefore, the substrate holder 22 can rotate the substrate 21 attractively supported on a placement surface, along the process target surface. Although a magnetic fluid is used as the rotary motion feedthrough 16 for vacuum, it is to be understood that the rotary motion feedthrough 16 for vacuum is not so limited.

Also, the substrate holder 22 is provided with a position sensor 23 as a position detecting means, and can detect the rotational position of the substrate 21. In the first embodiment, a rotary encoder is used as the position sensor 23. In the first embodiment, any configuration may be used as the position sensor 23, provided only that the configuration can detect the rotational position of the substrate 21 being rotated, as is the case with the above-mentioned rotary encoder, for example.

In the first embodiment, a sensor such as the position sensor 23 is used to directly detect the rotational position of the substrate 21 or the substrate holder 22 and thereby detect the rotational position of the substrate 21 held on the substrate holder 22; however, any configuration may be used, provided only that the configuration can detect the rotational position of the substrate 21. The rotational position of the substrate may be indirectly obtained for example by calculating it from the speed or time of rotation of the substrate holder 22, or by doing the like.

The substrate 21 is held on the placement surface of the substrate holder 22, while keeping its horizontal position. Although a disc-shaped silicon wafer, for example, is used as a material for the substrate 21, it is to be understood that the substrate 21 is not so limited.

FIG. 2 illustrates a process substrate on which many mesa structures 211 are formed, as described above. The mesa structures 211 are arranged in regular order with their longitudinal directions aligned parallel to each other. Also, in the first embodiment, side surfaces 211a, 211b along the longitudinal direction are process target surfaces of the mesa structure 211 by sputtering (or desired surfaces to be subjected to film deposition with good uniformity). In other words, the side surfaces 211a, 211b as two side surfaces opposite to each other out of plural side surfaces of the mesa structure 211 are the process target surfaces. As can be seen from FIG. 2, the side surface 211a is a surface of the mesa structure 211, facing toward the outside of the substrate 21, and the side surface 211b is a surface of the mesa structure 211, facing toward the center of the substrate 21. Also, in the first embodiment, the mesa structure is provided in such a manner that a longitudinal surface of the mesa structure 211 faces a notch or orientation flat 212.

Also, plural cathode units 40 are arranged obliquely above the substrate holder 22 in the processing space in the chamber 10 (or at a position diagonally opposite to the substrate holder 22). The cathode unit 40 is configured to be capable of supporting a sputtering target 400 (hereinafter referred to as a target). In other words, the plural cathode units 40 are provided for one substrate holder 22, and the cathode units 40 are attached in a tilted position to the upper lid 14.

As illustrated in FIGS. 1 and 3, in the first embodiment, the upper lid 14 is provided with five cathode units 40 (40a to 40e); however, the number of the cathode units 40 is not so limited. Also, one cathode unit 40 may be provided. In other words, at least one cathode unit for supporting the target may be provided in the vacuum chamber 10. The cathode units are inclined with respect to the process target surface of the substrate 21 on the substrate holder 22, and are arranged offset from each other at equally spaced intervals from a central axis of the substrate 21 in a surface direction thereof. Specifically, the cathode units 40 are located with their cathode central axes offset from an axis of rotation of the substrate holder 22, and are arranged concentrically at equally spaced intervals at a predetermined distance from the axis of rotation. The provision of the plural cathode units 40 in one and the same chamber 10 in this manner enables deposition of a multilayered film made of plural different materials in the one chamber 10.

Here, the substrate or the target is not particularly limited in diameter; however, when the substrate 21 is rotated in a manner like the first embodiment with the center of the substrate and the center of the cathode arranged offset from each other, film deposition with excellent uniformity can be achieved even if the diameter of the target is smaller than the diameter of the substrate.

The underside of the cathode of each of the cathode units 40 is provided with a magnetron having an arrangement of plural permanent magnets (or cathode side magnets) so as to form a magnetic field on the upper side of the target.

The targets in the form of plate are attached on the upper sides of the cathodes of the cathode units 40, respectively. In other words, the targets are provided closer to the processing space than the cathodes, and the targets are arranged facing obliquely downward. Target materials vary according to the type of film to be deposited on the substrate. In the first embodiment, five types of targets of different material ingredients, for example, are attached because the five cathode units 40 are arranged; however, the number of target types is not so limited.

A discharge power supply 70 for applying a voltage to the cathodes is electrically connected to the cathode units 40. Any of radio-frequency power, DC (direct-current) power, and the radio-frequency power which superimposes itself on the DC power may be used as discharge power. Also, for selective application of a voltage to the plural cathode units 40, discharge power supplies may be individually connected to the cathode units 40. Alternatively, the discharge power supply 70 may be configured as a common power supply to include a switching mechanism such as a switch for providing a selective supply of power. In other words, a multilayered film can be deposited on the substrate 21 by applying a voltage sequentially or alternately to the cathode units 40.

Further, a discharge gas introduction system 41 for supplying a processing gas for discharge (or a discharge gas) in the vicinity of the cathodes is connected to casings of the cathode units 40. An inert gas such as Ar (argon) or Kr (krypton), for example, is used as the discharge gas. The cathodes induce plasma discharges between the cathodes and the substrate holder 21 thereby to enable sputtering of the targets attached to the cathode units 40.

Also, a shutter 45 for selectively shutting off some of the cathodes from the substrate holder 22 is provided forward of the cathode units 40. Selective opening of the shutter 45 enables selecting a desired target from among the plural cathode units 40 and performing sputtering of the desired target, and enables preventing contamination from other targets being sputtered.

Figure 4:
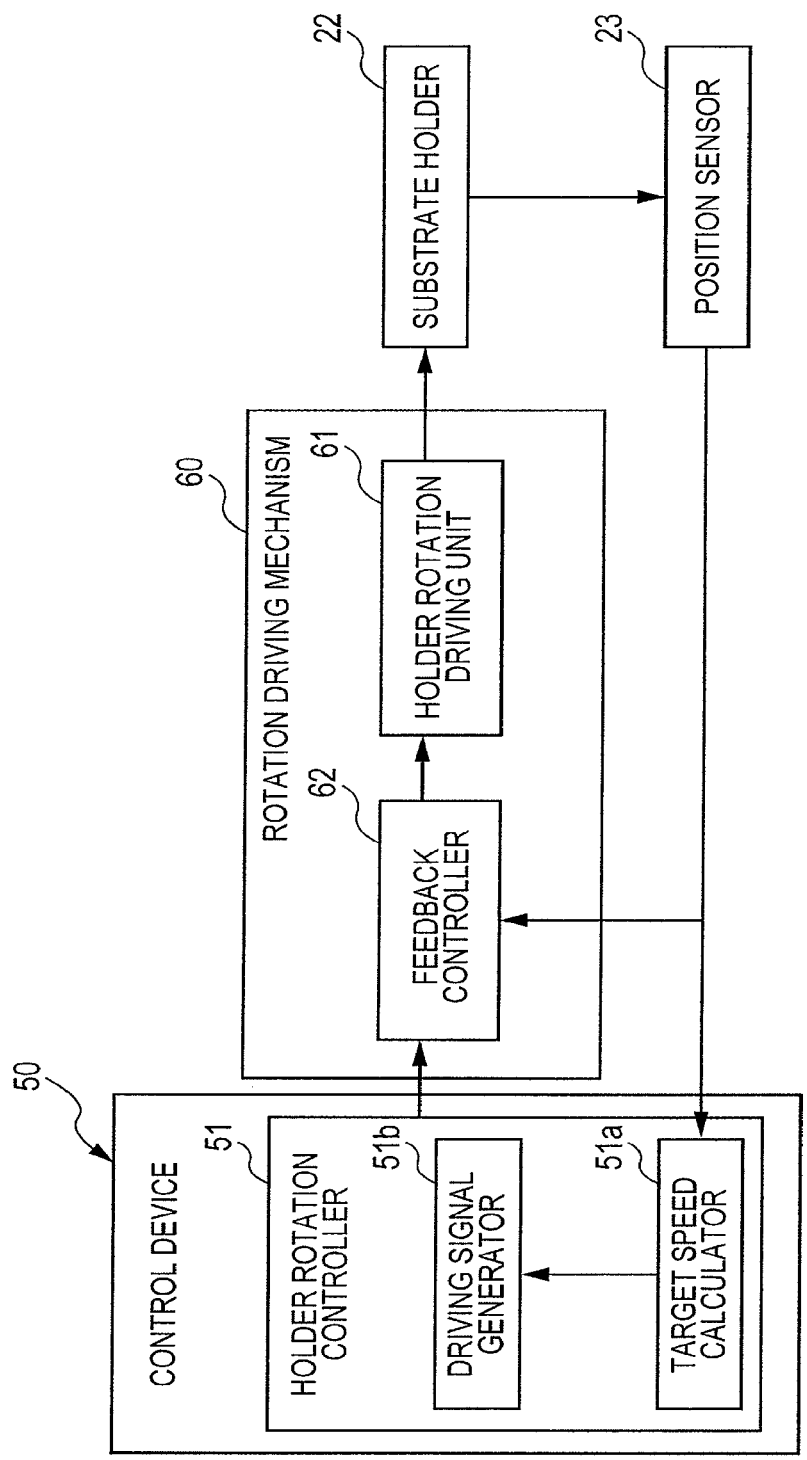
FIG. 4 is a block diagram illustrating a control device according to one embodiment of the present invention.

Next, description will be given with reference to FIG. 4 with regard to a control device 50 for controlling the above-described structural components, included in the sputtering apparatus 1 of the first embodiment. FIG. 4 is a block diagram illustrating the control device of the first embodiment.

As illustrated in FIG. 4, the control device 50 of the first embodiment includes a general-purpose computer and various kinds of drivers, for example. In other words, the control device 50 includes a CPU (central processing unit) (unillustrated) which executes various arithmetic, control, decision and other operations, and a ROM (read only memory) which stores various control programs to be executed by the CPU, and the like. Also, the control device 50 includes a RAM (random access memory) which temporarily stores data under the above-described CPU's operations, input data, and the like, and a nonvolatile memory such as a flash memory or an SRAM (static RAM). In such a configuration, the control device 50 executes film deposition operations under a predetermined program stored in the ROM or under a command from a host computer. Specifically, the control device 50 outputs commands to the discharge power supply 70, a driving unit of the shutter 45, the discharge gas introduction system 41, the inert gas introduction system 13, the evacuation pump 11, the rotation driving mechanism 60 for the substrate holder 22, and the like. Various process conditions such as discharge time, discharge power, selection of a target, process pressure, and rotation of the substrate holder 22 are controlled under the commands. Also, an output value from a pressure gauge for measuring pressure in the chamber 10 or from the sensor such as the position sensor 23 as the position detecting means for detecting the rotational position of the substrate can be acquired, thus enabling control according to the state of the apparatus.

Also, the control device 50 includes a holder rotation controller 51 as a rotation control means for adjusting a rotation speed of the substrate 21 according to the rotational position detected by the position sensor 23. The holder rotation controller 51 includes a target speed calculator 51a and a driving signal generator 51b, and has the function of controlling the rotation speed of the substrate 21 by controlling rotation of a rotating unit of the substrate holder 22 according to the rotational position of the substrate, based on the relative positions of the rotational position of the substrate 21 and the cathode unit 40 in the process of discharging.

The control device 50 is configured to receive information on the rotational position of the substrate from the position sensor 23. When the control device 50 receives the information on the rotational position, the target speed calculator 51a calculates a target rotation speed at the present rotational position of the substrate 21, based on the value of the present rotational position of the substrate 21 outputted by the position sensor 23 which detects the rotational position of the substrate 21. The value of the target rotation speed can be calculated for example by holding a correspondence between the rotational position of the substrate 21 and the target rotation speed as a map beforehand. The driving signal generator 51b generates a driving signal to achieve the target rotation speed, based on the target rotation speed calculated by the target speed calculator 51a, and outputs the driving signal to the rotation driving mechanism 60. The control device 50 is configured to transmit the driving signal generated by the driving signal generator 51b to the rotation driving mechanism 60.

In an example illustrated in FIG. 4, the rotation driving mechanism 60 includes a holder rotation driving unit 61 such as a motor which drives the substrate holder 22, and a feedback controller 62 which determines a manipulated variable for the holder rotation driving unit 61, based on a deviation of an actual value (i.e. the rotational position or the rotation speed) outputted by the position sensor 23 from a target value, and a servo mechanism is used to drive the substrate holder 22. However, feedback control is not an essential configuration of the present invention, and also, any of a DC motor and an AC (alternating-current) motor may be used as the motor. The rotation driving mechanism 60 drives the holder rotation driving unit 61 thereby to rotate the substrate holder 22, based on the driving signal received from the control device 50.

Next, description will be given with regard to a sputtering method carried out by using the apparatus 1, in conjunction with operation of the sputtering apparatus 1 of the first embodiment.

In the sputtering method using the sputtering apparatus according to the first embodiment, first, the substrate 21 (or the wafer) as the processing object is placed on the substrate holder 22. For example, the substrate 21 is carried onto the substrate holder 22 through the gate valve (unillustrated) by the handling robot included in the adjacent vacuum transfer chamber (unillustrated), while the degree of vacuum in the chamber 10 is maintained.

Then, the discharge gas such as Ar is introduced into the chamber 10 from the discharge gas introduction system 41. For reactive sputtering, the reactive gas is introduced into the chamber 10 from the reactive gas introduction system 13.

Five types of targets of different material ingredients, for example, are attached to the five cathode units 40, respectively. For example, the targets are given the shape of a circular plate and are all formed of the same size. As mentioned previously, an angle of inclination of the cathodes is not particularly limited for the application of the first embodiment; however, preferably, the cathode units 40 are arranged so that an angle $\varphi$ of the central axes of the cathodes with respect to a normal to the process target surface of the substrate 21 lies between 0° exclusive and 45° inclusive. More preferably, the angle $\varphi$ is set between 5° and 35°, both inclusive, thereby to achieve excellent in-plane uniformity.

Under this condition, first, the discharge power is supplied by a power supply (unillustrated) to the target surface of the first cathode unit 40a thereby to induce plasma discharge between the first cathode unit 40a and the substrate holder 22, effect sputtering of a first target, and deposit a first layer on the substrate 21.

At the time of film deposition, during discharging by the first cathode unit 40a, the position sensor 23 detects the rotational position of the substrate 21, and also, the holder rotation controller 51 performs control according to the detected rotational position thereby to adjust the rotation speed of the substrate 21 according to the rotational position detected by the position sensor 23.

After that, the power supply is switched in sequence, and film deposition operations are performed in the same manner for the second to fifth cathode units 40b to 40e.

Figure 5:
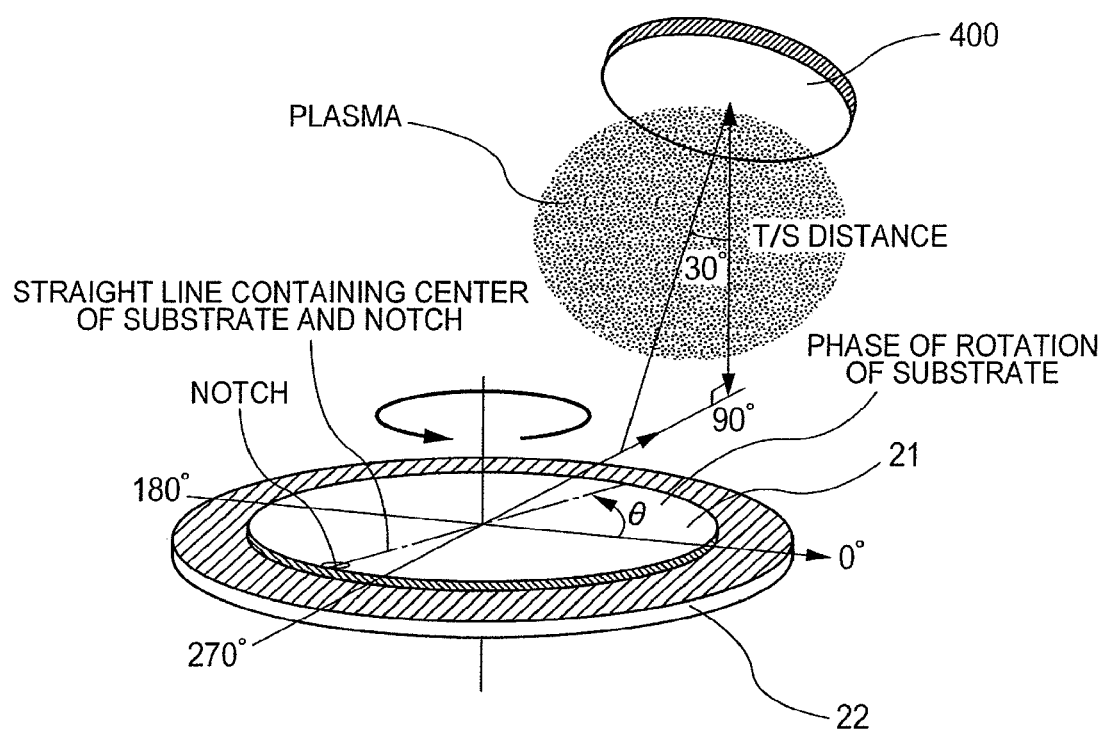
FIG. 5 is a view of assistance in explaining the relative positions of a target and the substrate and a phase of the substrate, according to one embodiment of the present invention.

Control of the rotation speed of the substrate will be described in further detail below. FIG. 5 is a view of assistance in explaining the relative positions of the target and the substrate and a phase of the substrate in the first embodiment. Also, FIG. 6 is an explanatory graph illustrating a control map of the rotation speed of the substrate in the sputtering method using the apparatus according to the first embodiment.

The relative positions of the target and the substrate in the first embodiment will be described by using FIG. 5. The substrate 21 is placed on the rotatable substrate holder 22, and the target 400 is arranged obliquely above the substrate 21 so that a normal to the target 400 is inclined 30° with respect to the normal to the substrate. Further, the normal to the target 400 neither needs to intersect the center of the substrate nor needs to intersect a substrate surface. A distance from the center of the target 400 in the form of circular plate to a plane containing the substrate surface is defined as a T/S distance, and, in the first embodiment, the distance T/S is set to 240 mm.

Next, description will be given with regard to a phase of rotation of the substrate in the first embodiment. As illustrated in FIG. 5, a rotation phase (or rotation angle) $\theta$ of the substrate is defined as 90° at a position closest to the target and as 270° at a position farthest away from the target, and is defined as 0° at a point to which the angle $\theta$ of rotation is rotated 90° clockwise from the 90° position and as 180° at a point to which the angle $\theta$ of rotation is rotated 90° counterclockwise from the 90° position. For the sake of convenience, a starting point for substrate rotation is set to a condition where the notch or orientation flat 212 of the substrate 21 is in the 180° position; however, it is to be understood that the starting point is not so limited. Also, as illustrated in FIG. 2, in the first embodiment, the substrate 21 is provided in such a manner that the notch or orientation flat 212 faces the longitudinal surface of the mesa structure 211. Thus, when the notch or orientation flat 212 is in the 90° and 270° positions, the longitudinal surface and the target are in facing relation to each other.

As an example of the sputtering method using the apparatus according to the first embodiment, the rotation speed is controlled so that a rotation speed y of the substrate forms a sinusoidal wave with respect to the phase $\theta$ of rotation of the substrate, as represented in FIGS. 5 and 6 and by Equation (1).

$$y = A \sin(2(\theta - \alpha)) + B \quad (1)$$

$$A = a \cdot B \quad (2)$$

In other words, the holder rotation controller 51 as the rotation control means of the present invention calculates the rotation speed as a period doubling sinusoidal function of the angle $\theta$ of rotation of the substrate 21, based on Equation (1). Here, A denotes amplitude of the rotation speed, which is obtained by multiplying reference speed B by a coefficient a of variation, as represented by Equation (2). $\alpha$ denotes a phase difference, and film thickness distribution on the side surfaces of the mesa structure can be optimized by varying the coefficient a of variation and the phase difference $\alpha$. Here, the phase $\theta$ of rotation of the substrate lies between 0° inclusive and 360° exclusive (0°≤$\theta$<360°).

An example of FIG. 6 illustrates the rotation speed y of the substrate relative to the phase $\theta$ of rotation of the substrate when the reference speed B is set to 30 rpm, the coefficient a of variation is set to 0.3 and the phase difference $\alpha$ is set to 45°. This instance indicates that a revolution speed (or rotation speed) of the substrate is lowest when the notch or orientation flat 212 of the substrate 21 is in the 0° and 180° positions, and that the revolution speed is highest when the notch or orientation flat 212 is in the 90° and 270° positions.

Conversely, in order that the revolution speed of the substrate is highest when the notch or orientation flat 212 of the substrate 21 is in the 0° and 180° positions, and that the revolution speed is lowest when the notch or orientation flat 212 is in the 90° and 270° positions, the phase difference $\alpha$ may be set to −45° or 45°. In this case, two side surfaces of the mesa structure 211 illustrated in FIG. 2, opposite to each other along a direction orthogonal to the longitudinal direction of the mesa structure 211, for example, are the process target surfaces.

In the first embodiment, the side surfaces 211a, 211b of the mesa structure 211 are the process target surfaces of the mesa structure 211. Therefore, the holder rotation controller 51 generates a driving signal so that the rotation speed is lowest, when the angle $\theta$ of rotation is 0° and 180°, or equivalently, when the longitudinal direction of the mesa structure 211 is parallel to a plane A containing a line segment which links the center of the target 400 to be deposited and the center of rotation of the substrate holder 22, the plane A being perpendicular to a substrate supporting surface of the substrate holder 22 (or the substrate process surface (surface to be processed of the substrate) of the substrate 21) (hereinafter, this state will be sometimes called a "first rotation mode"). Meanwhile, the holder rotation controller 51 generates a driving signal so that the rotation speed is highest, when the angle $\theta$ of rotation is 90° and 270°, or equivalently, when the longitudinal direction of the mesa structure 211 is perpendicular to the plane A (hereinafter, this state will be sometimes called a "second rotation mode").

In the first embodiment, attention is directed to a certain mesa structure 211 on the substrate 21. In the second rotation mode, when the angle $\theta$ of rotation is 90° and the side surface 211a as the surface facing toward the outside of the substrate 21 faces the target 400, the side surface 211b as the surface facing toward the center of the substrate 21 is hidden from the target 400. At this time, although a little film deposition occurs on the side surface 211b, film deposition on the side surface 211a becomes dominant. Meanwhile, in the second rotation mode, when the angle of rotation is 270°, the side surface 211b as the second surface faces the target 400, and the side surface 211a as the first surface is hidden from the target 400. At this time, although a little film deposition occurs on the side surface 211a, film deposition on the side surface 211b becomes dominant.

At this time, a first distance between the side surface 211a on which film deposition becomes dominant when the angle $\theta$ of rotation is equal to 90° ($\theta$=90°) and the target 400 is shorter than a second distance between the side surface 211b on which film deposition becomes dominant when the angle $\theta$ of rotation is equal to 270° ($\theta$=270°) and the target 400. Therefore, when the amount of emissions of sputter particles from the target 400 is kept constant, the thickness of a film formed on the side surface 211a when the angle $\theta$ of rotation is equal to 90° ($\theta$=90°) is greater than the thickness of a film formed on the side surface 211b when the angle $\theta$ of rotation is equal to 270° ($\theta$=270°). With regard to this, the same holds true for mesa structures other than mesa structures arranged on a line passing through the center of the substrate holder 22 when the angle θ of rotation is equal to 0° (θ=0°) and extending from 90° to 270° of the angle θ of rotation.

In the first embodiment, therefore, the rotation of the substrate holder 22 is controlled so as to make the rotation speed of the substrate 21 in the second rotation mode as high as possible, thereby to achieve minimization of film deposition in the second rotation mode which becomes a major cause of variations in film thickness between the side surface 211a and the side surface 211b.

Meanwhile, in the case of the first rotation mode, the longitudinal direction of the mesa structure 211 is parallel to the plane A. At this time, the target 400 is located on the side in a direction which is parallel to the side surface 211a and the side surface 211b and is parallel to an in-plane direction of the substrate 21. Therefore, the side surface 211a and the side surface 211b face the target 400 in the same manner. Consequently, the distance between the side surface 211a and the target 400 and the distance between the side surface 211b and the target 400 can become substantially identical to thus enable achieving film deposition with reduced variations in film thickness between the side surface 211a and the side surface 211b. In this manner, film deposition with more excellent uniformity in film thickness throughout the side surface 211a and the side surface 211b can be achieved by increasing film deposition in the first rotation mode as much as possible. In the first embodiment, the rotation of the substrate holder 22 is controlled so as to make the rotation speed of the substrate 21 in the first rotation mode as low as possible.

At this time, the first mode and the second mode each appear twice during one rotation of the substrate 21 having the mesa structure 211 having four outer wall surfaces. Preferably, therefore, the holder rotation controller 51 controls the rotation of the substrate holder 22 according to a sinusoidal function in which a local maximum value and a local minimum value each appear twice during one rotation of the substrate holder 22 (or a sinusoidal function in which the sinusoidal wave of the rotation speed advances two periods during the one rotation), or equivalently, a relationship between the angle θ of rotation and the rotation speed y of the substrate (or the rotation speed of the substrate holder 22) as represented by Equation (1) and in FIG. 6.

In the first embodiment, the control map illustrated in FIG. 6 may be stored beforehand in the memory such as the ROM included in the control device 50. Thus, in the first embodiment, the control map is stored in the memory beforehand. Therefore, upon receipt of the information on the rotational position of the substrate from the position sensor 23, the target speed calculator 51a refers to the control map illustrated in FIG. 6 stored in the memory, extracts the rotation speed corresponding to the present angle θ of rotation of the substrate 21, acquires the target rotation speed, and outputs the acquired target rotation speed to the driving signal generator 51b. Therefore, in the first rotation mode in which the angle θ of rotation is 0° and 180°, the rotation speed of the substrate 21 can be controlled to become lowest, and, in the second rotation mode in which the angle θ of rotation is 90° and 270°, the rotation speed of the substrate 21 can be controlled to become highest.

Thus, in the first embodiment, film deposition in the first rotation mode is made dominant over film deposition in the second rotation mode thereby to enable reducing the influence of film deposition which becomes a factor in non-uniformity in film thickness between the first surface (or the side surface 211a) and the second surface (or the side surface 211b) in a certain mesa structure, thus increasing the influence of film deposition such that the film thickness becomes more uniform between the first surface and the second surface.

Thus, in the first embodiment, it is important that film deposition in the first rotation mode be dominant over film deposition in the second rotation mode which becomes the cause of variations in film thickness between the first surface and the second surface. Therefore, the holder rotation controller 51 merely controls the rotation of the substrate holder 22 such that the rotation speed of the substrate 21 in the first rotation mode is lower than the rotation speed of the substrate 21 in the second rotation mode, and thereby, the film deposition in the first rotation mode can become dominant over the film deposition in the second rotation mode, so that the advantageous effects of the present invention can be achieved.

Although the mesa structure 211 has been described above as the relief structure formed on the substrate 21, a trench structure or a V-groove formed in the process target surface of the substrate 21 may be adopted as the relief structure. Examples of such trench structures and V-grooves include trench structures and V-grooves having rectangular openings formed therein and being arranged with their longitudinal directions aligned parallel to each other. Also, an inverted trapezoid structure whose width becomes narrower in a direction from its opening to bottom surface may be adopted as an example of the trench structure.

Thus, when the trench structure or the V-groove is used as the relief structure, the holder rotation controller 51 controls the rotation of the substrate holder 22 so that the rotation of the substrate holder 22 is relatively slow (or preferably, the rotation speed takes on a minimum value), when a direction parallel to two inner wall surfaces facing each other (e.g. two inner wall surfaces of the trench structure or the V-groove, parallel to its longitudinal direction), as process target surfaces, is parallel to the plane A. Also, the holder rotation controller 51 controls the rotation of the substrate holder 22 so that the rotation of the substrate holder 22 is relatively fast (or preferably, the rotation speed takes on a maximum value), when two inner wall surfaces facing each other, as process target surfaces, of four inner wall surfaces of the trench structure or the V-groove, are perpendicular to the plane A.

Thus, in the first embodiment, when the relief structure has a concave or convex structure regardless of the mesa structure, the trench structure, the V-groove or a wave-shaped relief structure to be described later, the holder rotation controller 51 controls the rotation driving mechanism 60 so that the rotation speed of the substrate 21 is relatively low, when the target 400 to be deposited is located on the side in a direction (hereinafter sometimes called a first direction) which is parallel to a side surface of the relief structure of the substrate 21 and is parallel to an in-plane direction of the substrate process surface (here, this state corresponds to the first rotation mode described above). Conversely, the holder rotation controller 51 controls the rotation driving mechanism 60 so that the rotation speed of the substrate 21 is relatively high, when the target 400 to be deposited is located on the side in a direction (hereinafter sometimes called a second direction) which is perpendicular to the first direction and is parallel to the in-plane direction of the substrate process surface (here, this state corresponds to the second rotation mode described above).

Therefore, when the target is arranged obliquely above the substrate and film deposition takes place while rotating the substrate, it is possible to reduce the rate of film deposition under a condition which contributes greatly to variations in film thickness between the first surface and the second surface of the relief structure, and to increase the rate of film deposition under a condition which contributes little to variations in film thickness between the first surface and the second surface. Therefore, uniformity in the film thickness of a film deposited on the first surface and the film thickness of a film deposited on the second surface can be improved.

Next, examples of the first embodiment will be described by using the drawings.

Example 1

Substrates having relief structures thereon were examined for film thickness distribution by using the sputtering apparatus 1 according to the first embodiment. Here, the film thickness distribution was determined from a maximum value and a minimum value of film thickness in the substrate surface by Equation (3).

(Maximum value−Minimum value)/(Maximum value+Minimum value)×100(%)  (3)

Figure 7A:
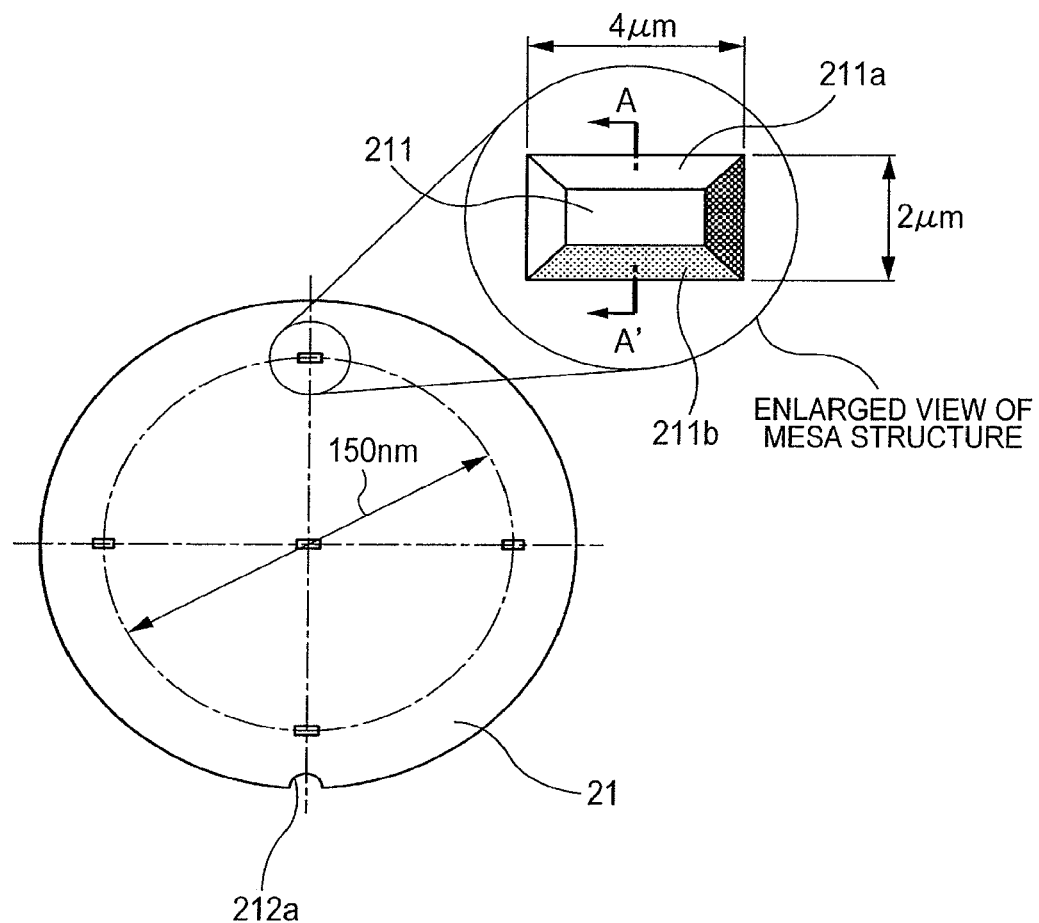
FIG. 7A is a view of assistance in explaining the substrate on which the mesa structure is formed, according to one embodiment of the present invention.
Figure 7B:
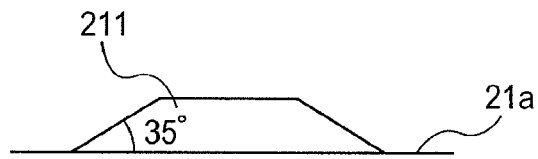
FIG. 7B is a cross-sectional view taken along line A-A' of FIG. 7A.

FIG. 7A represents a schematic view of the substrate with the mesa structures, used for verification of the advantageous effects of the first embodiment. Also, FIG. 7B is a cross-sectional view of the mesa structure 211 illustrated in FIG. 7A, taken along line A-A'. The mesa structures 211 each having a rectangular bottom surface having dimensions of 4×2 μm are formed in the center of the substrate 21 which is a silicon (Si) substrate of 200 mm in diameter, and at points at a distance of 75 mm from the center in four directions including the direction of a notch 212a. The mesa structures 211 are arranged so that the longitudinal direction of the rectangle is perpendicular to a straight line containing the center of the substrate and the notch 212a. An object is to uniformly deposit thin films on two side surfaces of such a mesa structure 211, along the longitudinal direction, specifically, the notch-side side surface (or the side surface 212a) and the opposite-side side surface (or the side surface 212b), respectively. In Example 1, the notch-side side surface and the opposite-side side surface both having an angle of inclination of 35° with respect to a process target surface 21a of the substrate were used.

Comparisons were made for three conditions A, B and C described below, in order to check the advantageous effects of the first embodiment.
Condition A: The rotation speed of the substrate 21 (or the substrate holder 22) was set to 30 rpm, which was kept constant. In other words, in Equations (1) and (2), a was set equal to 0 (a=0), and B was set equal to 30 (B=30).
Condition B: The sinusoidal wave advances only one period during one rotation of the substrate 21 (or the substrate holder 22). Specifically, Equation (1) is transformed into Equation (4).

$$y = A \sin(\theta - \alpha) + B \quad (4)$$

The coefficient a of variation and the reference rotation speed B are set to 0.1 and 30, respectively, and, at this time, Equation (2) leads to A equal to 3 (A=3). α was set to 90°, which is an optimum value. Condition C: In an instance (i.e. the first embodiment) where the sinusoidal wave advances two periods during one rotation of the substrate 21 (or the substrate holder 22), a, B and A were set equal to 0.1 (a=0.1), (B=30), and 3 (A=3), respectively, in the same manner as the condition B. α was set to 45°, which is an optimum value. Other conditions for film deposition are as follows: a Cu (copper) target of 164 mm in diameter was used as the sputtering target, the angle of inclination of the normal to the target with respect to the normal to the substrate was set to 30°, the T/S distance was set to 240 mm, the power supplied to the target was set to 200 watts of direct-current power, and the flow rate of Ar gas introduced was set to 30 sccm. Under such conditions, a thin film of Cu was deposited to a thickness of 25 nm on the substrate of 200 mm in diameter.

Figure 8:
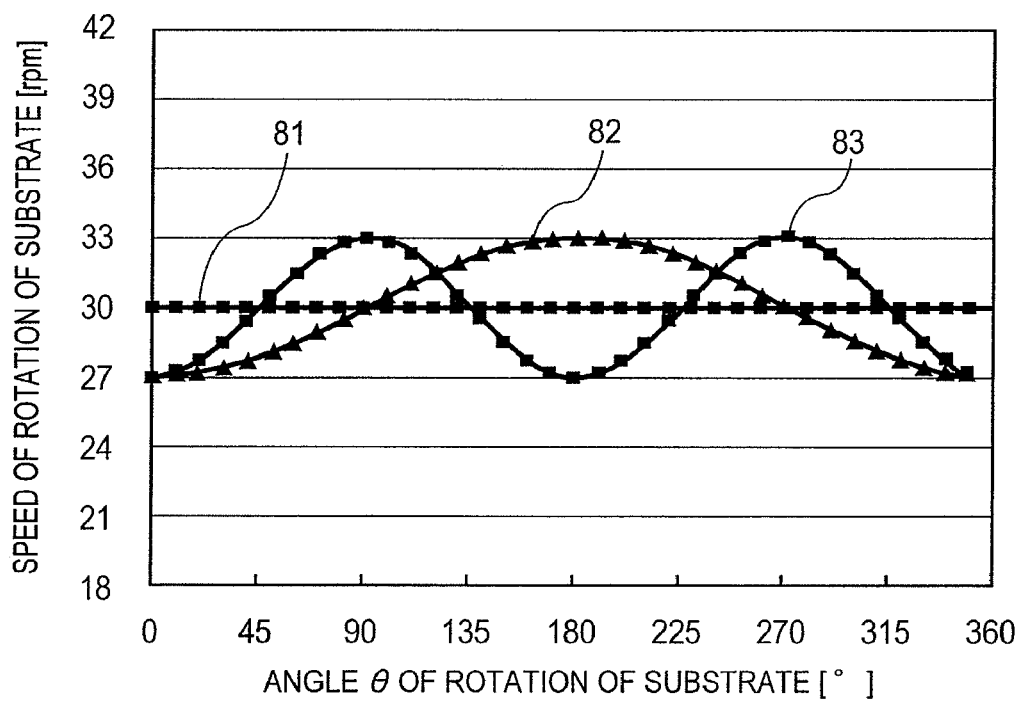
FIG. 8 is a graph illustrating a relationship between a rotation angle θ of the substrate and a rotation speed y of the substrate according to one embodiment of the present invention.

FIG. 8 represents a graph of the rotation speed y of the substrate relative to the phase θ of rotation of the substrate 21, for the conditions A, B and C. In FIG. 8, reference numeral 81 denotes a plot for the condition A; reference numeral 82, a plot for the condition B; and reference numeral 83, a plot for the condition C. Under the condition C where a is 45°, Equation (1) leads to a phase difference of 2a relative to the phase of rotation of the substrate, and in turn, to a phase difference of substantially 90°. At this time, when the phase θ of rotation of the substrate is in the 90° and 270° positions, the revolution speed (or the rotation speed) of the substrate takes on a maximum value, which is 33 rpm; when the phase θ of rotation is in the 0° and 180° positions, the revolution speed takes on a minimum value, which is 27 rpm. In other words, the rotation speed is the maximum, when the longitudinal direction of the mesa structure 211, which is a direction in which the desired side surfaces 211a, 211b of the mesa structure 211 extend, is perpendicular to the plane containing the line segment which links the center of the target and the center of rotation of the substrate holder 22, the plane being perpendicular to the substrate process surface. Also, the rotation speed is the minimum, when a direction parallel to both the side surfaces 211a, 211b is parallel to the plane.

Table 1 is a table of the maximum value and the minimum value of film thickness of the notch-side side surface (or the side surface 211b) and the opposite-side side surface (or the side surface 211a) of each of the five mesa structures 211 on the substrate 21, and measured results of the film thickness distribution obtained from Equation (3), in the case of film deposition under the conditions A to C.

In the case of the condition A where substrate rotation control is not performed, the distribution was ±3.3%. On the other hand, in the case of the condition B where substrate rotation control is performed so that the sinusoidal wave advances only one period during one rotation of the substrate, the optimum value was obtained when the phase difference α was 90°, but the film thickness distribution was quite the same as that in the case of the condition A. As opposed to these, in the case of the condition C where the first embodiment is applied, the optimum value could be obtained when the phase difference α was 45°, and, at that time, the film thickness distribution was ±2.7%. The best value of the film thickness distribution could be obtained, as compared to the condition A where the rotation control is not performed, and the condition B where the conventional method for rotation control is

TABLE 1

| Conditions | Maximum Value of Film Thickness (nm) | Minimum Value of Film Thickness (nm) | Film Thickness Distribution |
|---|---|---|---|
| A | 25.0 | 23.4 | ±3.3% |
| B | 25.0 | 23.4 | ±3.3% |
| C (First Embodiment) | 25.0 | 23.7 | ±2.7% |

Example 2

Under the condition C of Example 1, the coefficient a of variation was varied from 0.1 to 0.7 with the phase difference α fixed to 45° as the optimum value. Measured results of the film thickness distribution are shown in Table 2. In Example 2, it has been shown that the film thickness distribution is best when a is 0.5 (a=0.5).

TABLE 2

| Coefficient a of Variation under Condition C | Maximum Value of Film Thickness (nm) | Minimum Value of Film Thickness (nm) | Film Thickness Distribution |
|---|---|---|---|
| 0.1 | 25.0 | 23.7 | ±2.7% |
| 0.2 | 24.9 | 23.9 | ±2.0% |
| 0.3 | 24.9 | 24.0 | ±1.8% |
| 0.4 | 24.9 | 24.0 | ±1.8% |
| 0.5 | 24.8 | 24.0 | ±1.6% |
| 0.6 | 25.0 | 24.0 | ±2.0% |
| 0.7 | 25.3 | 24.0 | ±2.6% |

Example 3

Figure 9A:
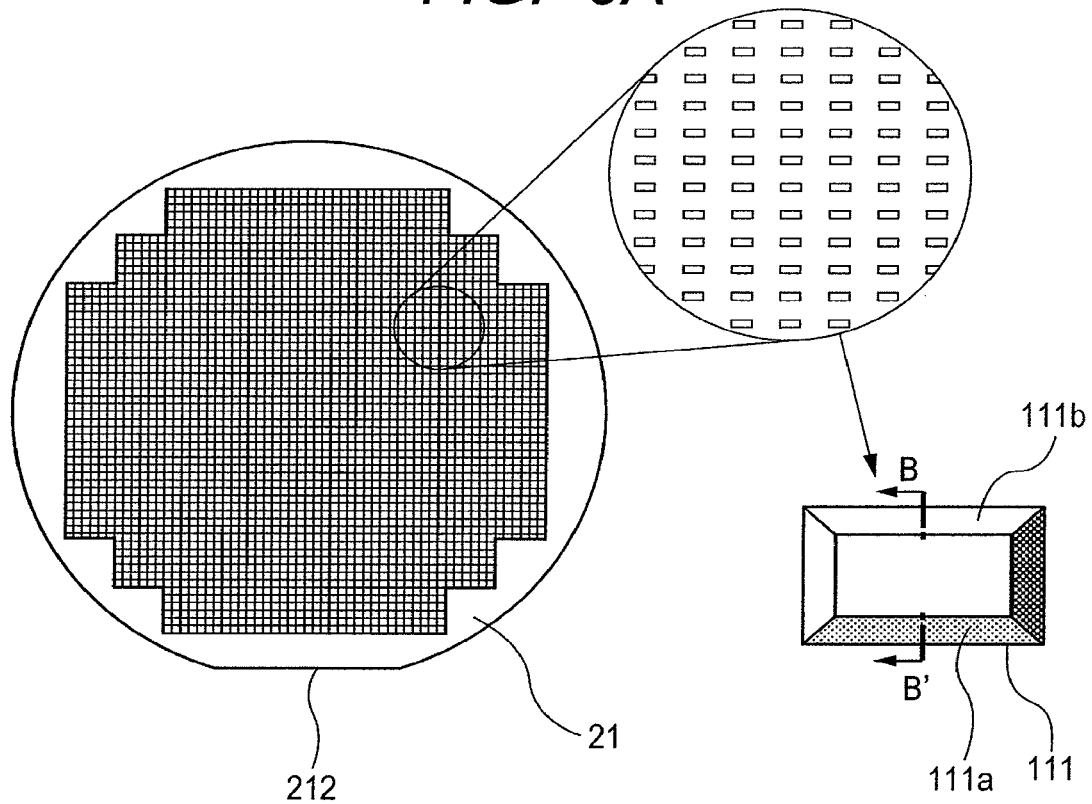
FIG. 9A is a view of assistance in explaining the substrate on which trench structures are formed, according to one embodiment of the present invention.
Figure 9B:
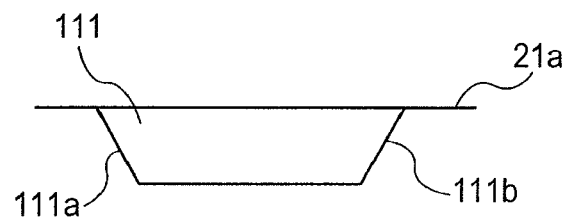
FIG. 9B is a cross-sectional view taken along line B-B' of FIG. 9A.

In Examples 1 and 2, even when a trench structure 111, as illustrated in FIGS. 9A and 9B, is adopted as the relief structure on the process target surface of the substrate, the effect of improving the film thickness distribution in the trench structure 111 can be expected by controlling the revolution speed of the substrate by using the period doubling sinusoidal function of the first embodiment.

In FIGS. 9A and 9B, an inner wall surface 111a is the first surface facing toward the outside of the substrate 21, an inner wall surface 111b is the second surface facing toward the center of the substrate 21, and these two surfaces are the process target surfaces. In Example 3, the holder rotation controller 51 controls the rotation of the substrate holder 22 by controlling the rotation driving mechanism 60 so that the rotation speed of the rotating holder 22 is relatively low (or preferably, the rotation speed takes on a minimum value), when the longitudinal direction of the trench structure 111 is parallel to the plane A. Further, the holder rotation controller 51 controls the rotation of the substrate holder 22 by controlling the rotation driving mechanism 60 so that the rotation speed of the rotating holder 22 is relatively high (or preferably, the rotation speed takes on a maximum value), when the longitudinal direction b of the trench structure 111 is perpendicular to the plane A.

Example 4

Figure 10A:
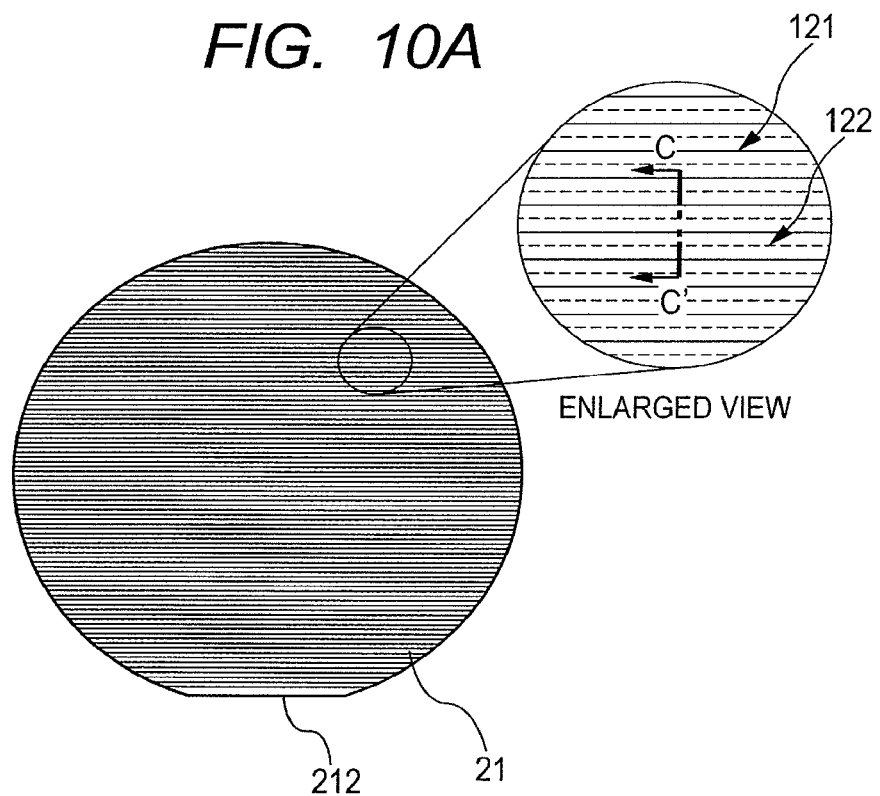
FIG. 10A is a view of assistance in explaining the substrate on which a wave-shaped relief structure is formed, according to one embodiment of the present invention.
Figure 10B:
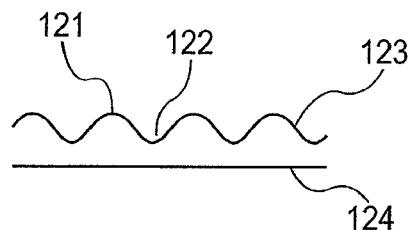
FIG. 10B is a cross-sectional view taken along line C-C' of FIG. 10A.

In Example 4, as the relief structure on the process target surface of the substrate 21, a relief structure having a periodic waveform in cross section (hereinafter sometimes called a "wave-shaped relief structure") is formed wholly or partially on a substrate process surface 123 of the substrate 21, as illustrated in FIGS. 10A and 10B. In Example 4, when peaks 121 and valleys 122 of the wave-shaped relief structures are in aligned and substantially parallel relation as illustrated in FIGS. 10A and 10B, the effect of improving the film thickness distribution in the substrate surface can be expected by controlling the revolution speed (or the rotation speed) of the substrate by using the period doubling sinusoidal function of the first embodiment. In FIGS. 10A and 10B, reference numeral 124 denotes the underside of the substrate 21.

Example 5

In Example 4, even when a cross-sectional waveform of the wave-shaped relief structure is one or more waveforms selected from the group consisting of a sinusoidal waveform, a rectangular waveform, a triangular waveform, and a trapezoidal waveform, as illustrated in FIGS. 11A to 11D, the effect of improving the film thickness distribution in the substrate surface can be expected by controlling the revolution speed of the substrate by using the period doubling sinusoidal function of the first embodiment.

In Examples 4 and 5, the holder rotation controller 51 controls the rotation of the substrate holder 22 by controlling the rotation driving mechanism 60 so that the rotation speed of the rotating holder 22 is relatively low (or preferably, the rotation speed takes on a minimum value), when the peaks and the valleys of the wave-shaped relief structures are parallel to the plane A. Further, the holder rotation controller 51 controls the rotation of the substrate holder 22 by controlling the rotation driving mechanism 60 so that the rotation speed of the rotating holder 22 is relatively high (or preferably, the rotation speed takes on a maximum value), when the peaks and the valleys are perpendicular to the plane A.

Example 6

Figure 12:
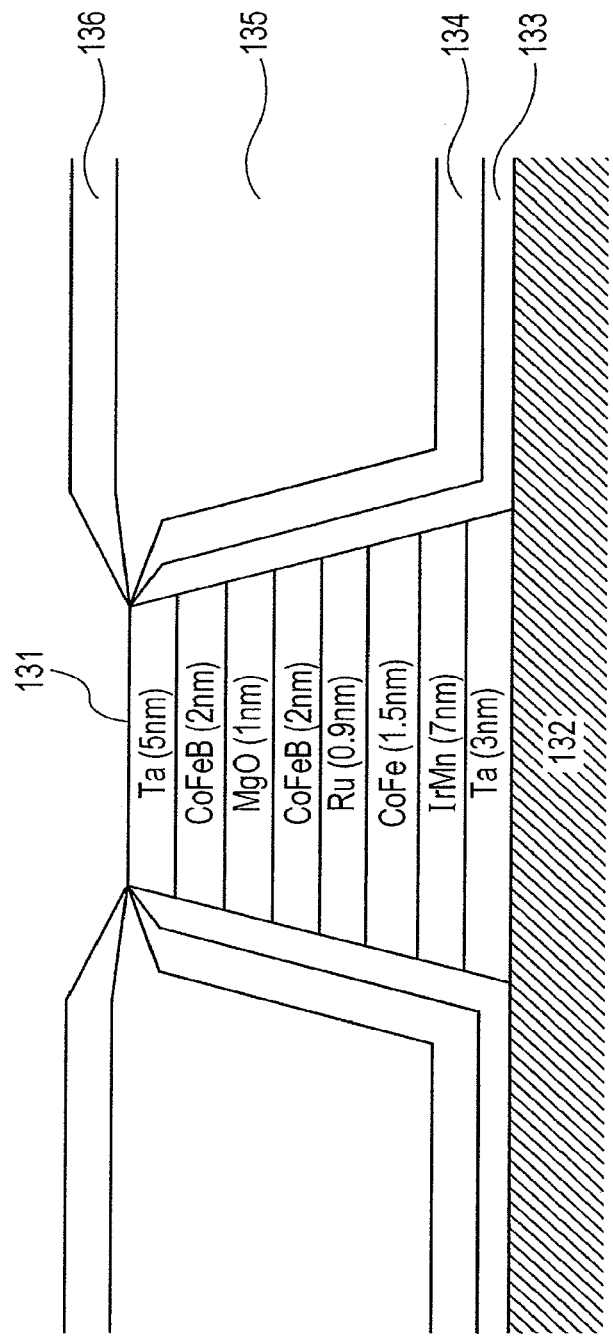
FIG. 12 is a view illustrating a TMR element as an example of the mesa structure formed on the substrate, according to one embodiment of the present invention.

FIG. 12 is an explanatory view illustrating a TMR element 131 for use in a magnetic head for a hard disk drive (HDD) as an example of the mesa structure on the substrate 21 according to the first embodiment. As employed herein, the TMR element refers to a magnetoresistive element (i.e. a TMR (Tunneling Magneto resistance) element).

As illustrated in FIG. 12, a basic layer configuration of the TMR element 131 includes a magnetic tunnel junction portion (or an MTJ portion) having a pinned magnetization layer, a tunnel barrier layer, and a free magnetization layer. For example, the pinned magnetization layer is made of a ferromagnetic material, the tunnel barrier layer is made of a metal oxide (e.g. magnesium oxide, alumina, etc.) insulating material, and the free magnetization layer is made of a ferromagnetic material. The TMR element 131 is formed on a lower electrode 132 formed on the substrate 21.

The TMR element 131 has the following properties: the TMR element has minimum electrical resistance, when an external magnetic field is applied with a certain current fed by applying a required voltage across ferromagnetic layers on both sides of the tunnel barrier layer and then the directions of magnetization of the ferromagnetic layers on both sides are parallel and the same (called a "parallel state"). Also, the TMR element 131 has the properties of having maximum electrical resistance when the directions of magnetization of the ferromagnetic layers on both sides are parallel and opposite (called an "antiparallel state"). Of the ferromagnetic layers on both sides, the pinned magnetization layer is formed so as to pin magnetization, and the free magnetization layer is formed so that the direction of magnetization can be reversed by the application of an external magnetic field for writing. Here, a material containing a ferromagnetic material such as Co (cobalt), Fe (iron) or Ni (nickel) as a main ingredient and having a material such as B (boron) added to these as appropriate, for example, may be used for the pinned magnetization layer.

The TMR element 131 is deposited on a flat substrate surface by a film deposition method such as sputtering, and is processed into a mesa form by ion milling method, reactive etching method, or the like. After that, an insulating film 133, a metal film 134, a magnetic film 135 and a metal film 136 are deposited on sidewall surfaces (e.g. the side surface 211a and the side surface 211b of the mesa structure 211 in FIG. 2) by a film deposition method such as sputtering. At this time, it is desirable that the above-mentioned films to be deposited on the sidewall surfaces each have a uniform film thickness on both the sidewall surfaces of the mesa form. Further, it is desirable that the TMR elements as the mesa structures arranged in regular order on the substrate surface throughout its entire area have a uniform film thickness. Therefore, the uniformity in film thickness can be improved by using the sputtering apparatus and the film deposition method of the first embodiment.

Second Embodiment

As described above, in the first embodiment, the rotation speed of the substrate (or the substrate holder) is controlled so that the rotation speed in the first rotation mode is different from the rotation speed in the second rotation mode, while the amount of emissions of sputter particles from the target is kept constant. However, continuous rotation or discontinuous pulse rotation may be adopted as the mode of rotation of the substrate (or the substrate holder). In a second embodiment, a form of the discontinuous pulse rotation will be described.

Figure 13A:
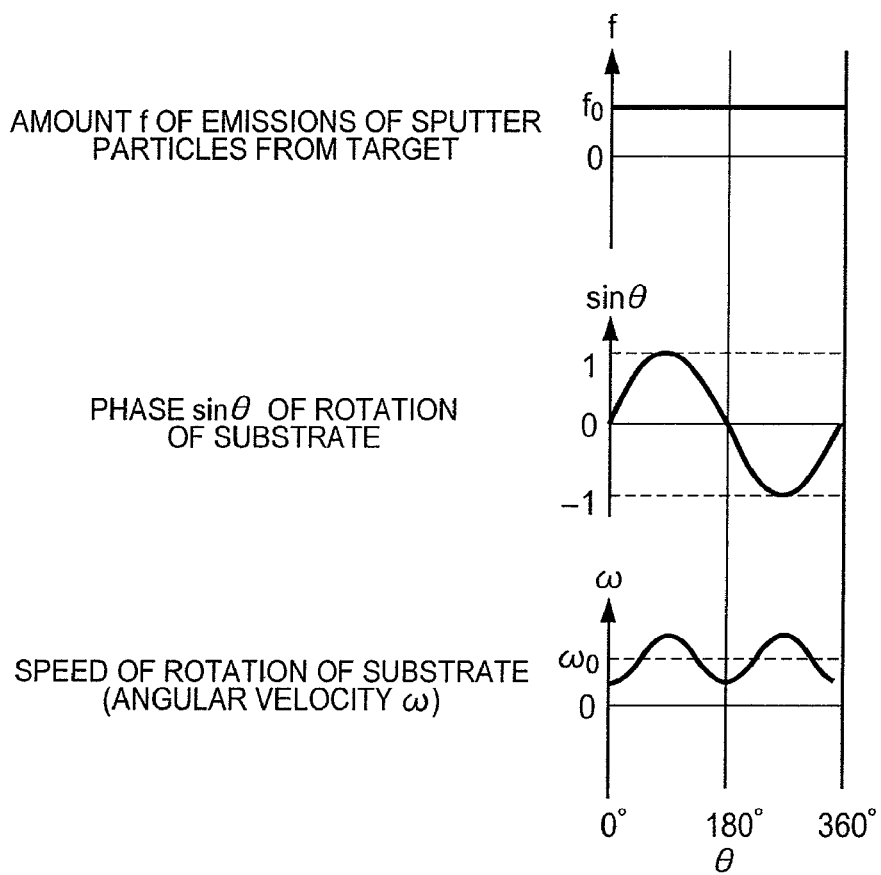
FIG. 13A is a graph of assistance in explaining continuous rotation of the substrate (or the substrate holder) when the rotation speed of substrate rotation is controlled, according to one embodiment of the present invention.
Figure 13B:
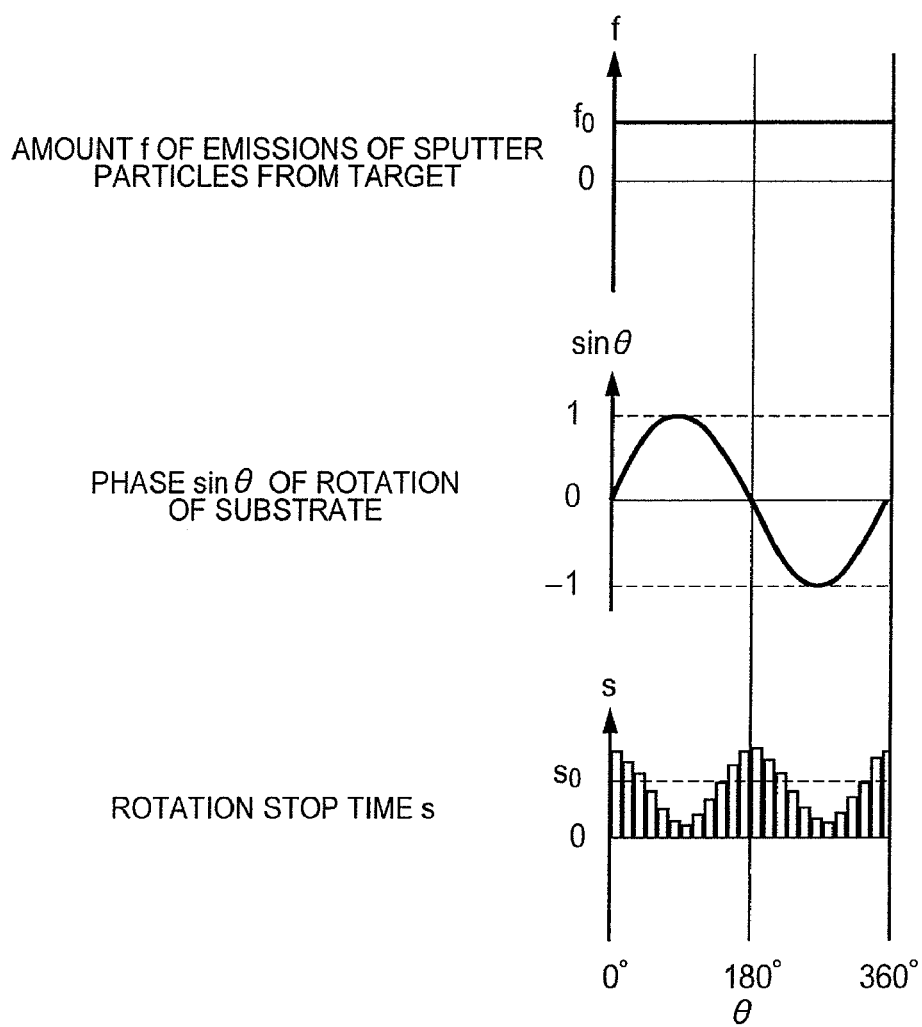
FIG. 13B is a graph of assistance in explaining discontinuous rotation of the substrate (or the substrate holder) when the rotation speed of substrate rotation is controlled, according to one embodiment of the present invention.

FIG. 13A is a graph of assistance in explaining continuous rotation of the substrate (or the substrate holder) when the rotation speed of substrate rotation is controlled, according to the first embodiment. FIG. 13B is a graph of assistance in explaining discontinuous rotation of the substrate (or the substrate holder) when the rotation speed of substrate rotation is controlled, according to the second embodiment.

For continuous rotation of the substrate 21 (or the substrate holder 22), the holder rotation controller 51 generates a driving signal so as to effect continuous change in the rotation speed (or angular velocity ω) of the substrate 21 so that the rotation speed of the substrate 21 is modulated by two periods during one rotation (or one period) of the substrate 21, according to Equation (1), as illustrated in FIG. 13A. In other words, the holder rotation controller 51 controls the rotation of the substrate holder 22 so that the substrate 21 rotates continuously. In FIG. 13A, $f_0$ denotes the reference amount of emissions of sputter particles from the target, and $\omega_0$ denotes reference angular velocity.

Meanwhile, when the rotation of the substrate 21 (or the substrate holder 22) is in discontinuous (or clock) form, the holder rotation controller 51 controls rotation stop time s as illustrated in FIG. 13B. In other words, for example, the holder rotation controller 51 controls the rotation of the substrate holder 22 so that the substrate 21 stops its rotation at plural predetermined angles of rotation and the rotating unit of the substrate holder 22 rotates at a constant angular velocity (or rotation speed) at the other angles of rotation. Under such control, the rotation speed of the substrate 21 is controlled so that the substrate 21 rotates discontinuously. Here, the holder rotation controller 51 may keep the rotation speed of the rotating unit of the substrate holder 22 constant as described above, or may effect change in the rotation speed. In the graph on which the vertical axis represents the rotation speed (or the angular velocity ω) and the horizontal axis represents time t, the time during which the angular velocity is 0 is herein called the "rotation stop time s." In other words, the rotation stop time s refers to the time during which the rotation of the substrate holder 22 is stopped in the case of discontinuous rotation of the substrate holder 22. $s_0$ denotes reference rotation stop time.

In the second embodiment, it is essential to increase the length of time during which the process target surface of the relief structure is parallel to the plane A, and to reduce the length of time during which the process target surface is perpendicular to the plane A. As described above, in the second embodiment, the first rotation mode and the second rotation mode each appear twice during one rotation of the substrate (or the substrate holder 22). In the second embodiment, therefore, the stop time for the substrate (or the substrate holder 22) is sinusoidally modulated by two periods during one rotation (or one period) of the substrate 21 (or the substrate holder 22). Therefore, the rotation stop time can become relatively long (or preferably, longest) when the target is located on the side in the direction which is parallel to the side surface of the relief structure and is parallel to the in-plane direction of the substrate process surface, and the rotation stop time can become relatively short (or preferably, shortest) when the target is located on the side in the direction which is perpendicular to the above-described direction and is parallel to the in-plane direction of the substrate process surface.

If the side surfaces 211a, 211b of the mesa structure 211 illustrated in FIG. 2 are the process target surfaces, when the angle θ of rotation is 0° and 180° (θ=0°, 180°), the target is located on the side in the direction in which the side surfaces 211a, 211b extend in the in-plane direction of the substrate process surface. Also, when the angle θ of rotation is 90° and 270° (θ=90°, 270°), the target is located on the side in the above-described extending direction and on the side in a perpendicular direction along the rotation of the substrate 21. As illustrated in FIG. 13B, therefore, the holder rotation controller 51 may generate a driving signal so that the rotation stop time s is relatively long when the angle θ of rotation is 0° and 180° (θ=0°, 180°), and so that the rotation stop time s is relatively short when the angle θ of rotation is 90° and 270° (θ=90°, 270°).

Third Embodiment

In the first and second embodiments, description has been given with regard to the forms of control of the rotation speed of the substrate holder 22; however, in a third embodiment, supply electric power (or supply power) for the cathode unit 40 is controlled thereby to control the amount of sputter particles flying to the substrate, thus achieving uniformity in film thickness between the process target surfaces of the relief structure.

The third embodiment also has a major feature that, when the substrate holder 22 rotates, the rate of film deposition is relatively increased when the target is located on the side in the direction which is parallel to the side surface of the relief structure and is parallel to the in-plane direction of the substrate process surface, and the rate of film deposition is relatively reduced when the target is located on the side in the perpendicular direction along the rotation of the substrate to the side in the above-described direction, as is the case with the first embodiment.

Figure 14:
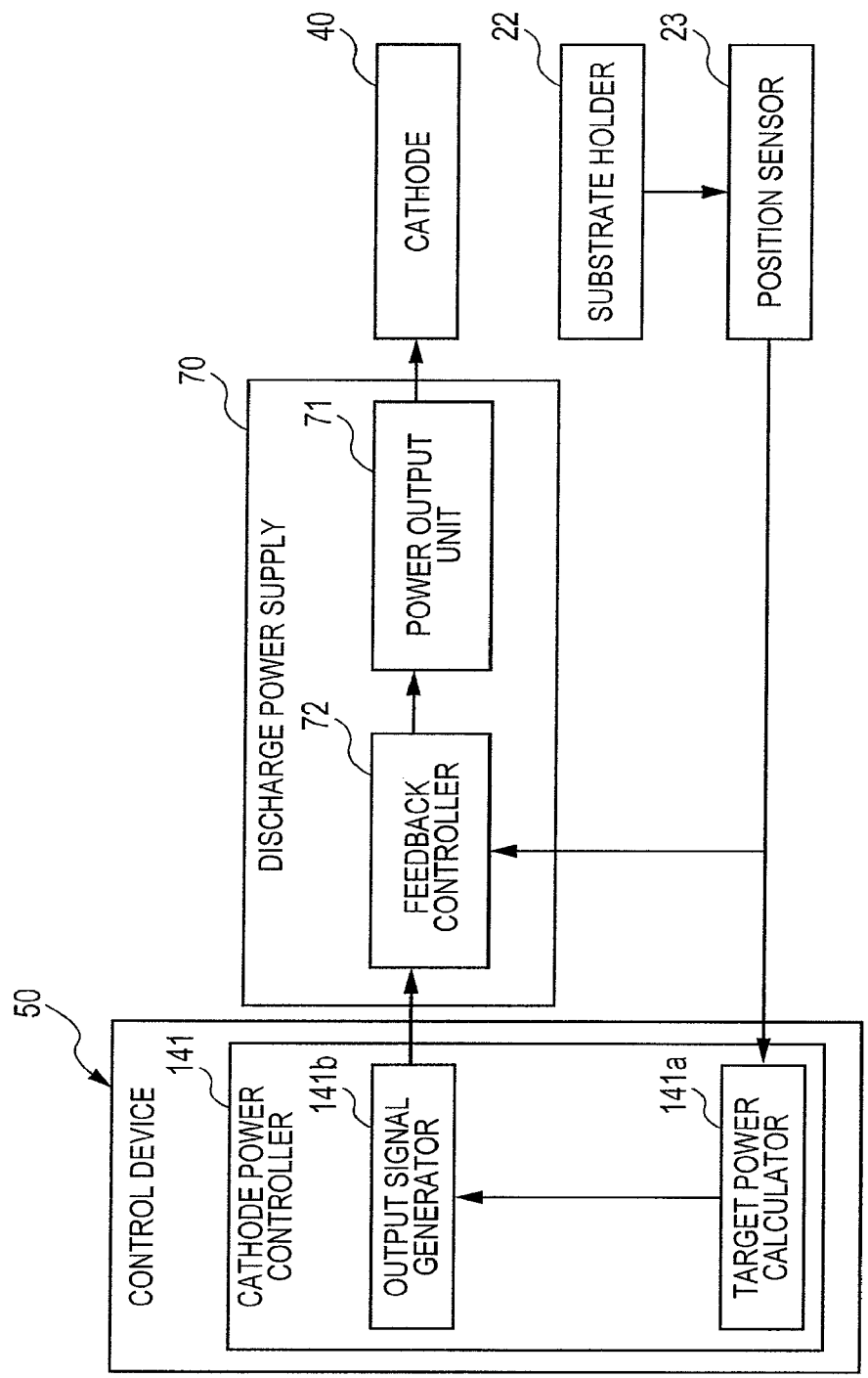
FIG. 14 is a block diagram illustrating the control device according to one embodiment of the present invention.

FIG. 14 is a block diagram of the control device 50 according to the third embodiment. In the third embodiment, the control device 50 includes a cathode power controller 141 as a power control means for adjusting power (or electric power) for the cathode unit 40 according to the rotational position detected by the position sensor 23. The cathode power controller 141 includes a target power calculator 141a and an output signal generator 141b, and has the function of controlling the power (or the electric power) for the cathode unit 40 according to the rotational position of the substrate, based on the relative positions of the rotational position of the substrate 21 and the cathode unit 40 in the process of discharging.

The control device 50 is configured to receive information on the rotational position of the substrate holder 22 from the position sensor 23. When the control device 50 receives the information on the rotational position, the target power calculator 141a calculates target power (or target electric power) at the present rotational position of the substrate holder 22, based on the value of the present rotational position of the substrate holder 22 inputted from the position sensor 23 which detects the rotational position of the substrate holder 22. The value of the target power can be calculated for example by holding beforehand a correspondence between the rotational position of the substrate holder 22 and the target power as a map in the memory or the like included in the control device 50. The output signal generator 141b generates an output signal to achieve the target power, based on the target power calculated by the target power calculator 141a, and provides the output signal to the discharge power supply 70. The control device 50 is configured to transmit the output signal generated by the output signal generator 141b to the discharge power supply 70.

In an example illustrated in FIG. 14, the discharge power supply 70 includes a power output unit 71 which supplies discharge power (or discharge electric power) to the cathode unit 40, and a feedback controller 72 which determines a manipulated variable for the power output unit 71, based on a deviation of an actual value (i.e. the rotational position or the rotation speed) outputted by the position sensor 23 from a target value. However, feedback control is not an essential configuration of the present invention.

A process of the third embodiment will be described below, giving an instance where the mesa structure 211 illustrated in FIG. 2 is used as the relief structure and the side surfaces 211a, 211b are the process target surfaces of the mesa structure 211 by sputtering. In the third embodiment, the rotation speed of the substrate holder 22 is kept constant.

In the third embodiment, when the rotating holder 22 rotates at a constant rotation speed, the discharge power supplied to the cathode unit 40 is controlled so that the amount of sputter particles flying to the substrate 21 (or the substrate holder 22) in the first rotation mode is larger than the amount of sputter particles flying to the substrate 21 in the second rotation mode. Therefore, when the side surfaces 211a, 211b as the process target surfaces of the mesa structure 212 face the cathode, the amount of sputter particles reaching the side surfaces 211a, 211b is small to thus enable suppressing variations in thickness of films formed on the side surface 211a and the side surface 211b. Meanwhile, when the side surfaces 211a, 211b are rotated 90° from a position facing the cathode, the amount of sputter particles reaching the side surfaces 211a, 211b is large to thus enable increasing the rate of film deposition when the side surface 211a and the side surface 211b face the target in the same manner. Therefore, film deposition which becomes the factor in non-uniformity in the film thickness on the side surface 211a and the film thickness on the side surface 211b can be reduced, and thus, film deposition which contributes greatly to a uniform film thickness on the side surface 211a and the side surface 211b can become dominant, so that variations in film thickness between the side surface 211a and the side surface 211b can be reduced.

Also in the third embodiment, continuous rotation or discontinuous pulse rotation may be adopted as the mode of rotation of the substrate holder, as is the case with the first embodiment.

Figure 15A:
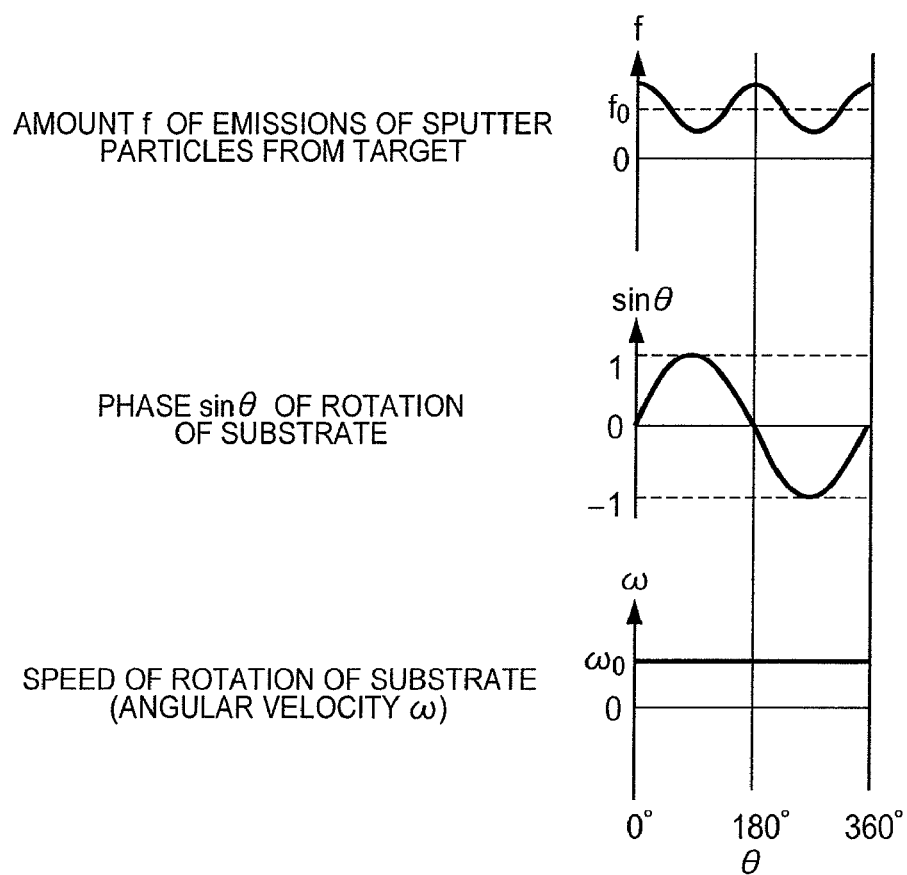
FIG. 15A is a graph of assistance in explaining continuous rotation of the substrate (or the substrate holder) when supply power for the cathode is controlled, according to one embodiment of the present invention.
Figure 15B:
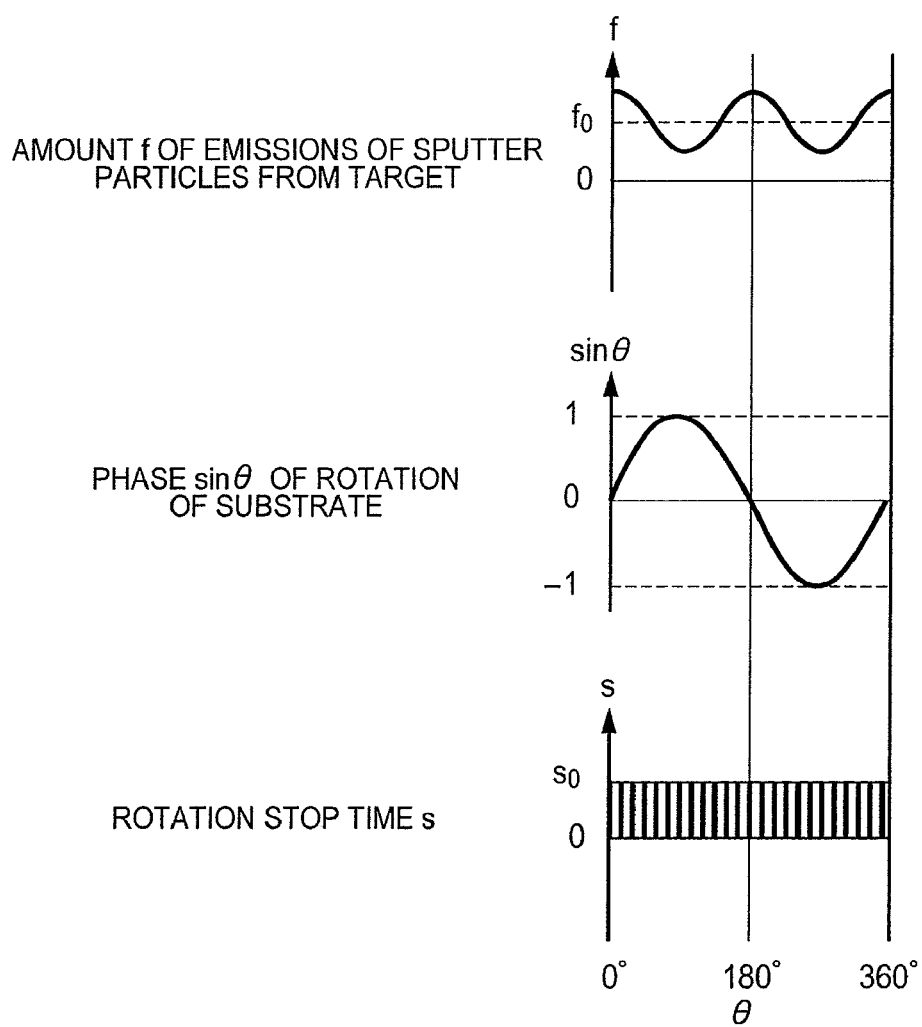
FIG. 15B is a graph of assistance in explaining discontinuous rotation of the substrate (or the substrate holder) when the supply power for the cathode is controlled, according to one embodiment of the present invention.

FIG. 15A is a graph of assistance in explaining continuous rotation of the substrate (or the substrate holder) when supply power for the cathode is controlled, according to the third embodiment. FIG. 15B is a graph of assistance in explaining discontinuous rotation of the substrate (or the substrate holder) when the supply power for the cathode is controlled, according to the third embodiment.

In the third embodiment, the cathode power controller 141 can calculate the discharge power according to the angle θ of rotation of the substrate 21 by using the same period doubling sinusoidal function as Equation (1). In other words, the cathode power controller 141 generates an output signal so as to effect continuous change in the supply power for the cathode unit 40 so that the supply power (or the supply electric power) for the cathode unit 40 is modulated by two periods during one rotation (or one period) of the substrate 21 (or the substrate holder 22). For example, as illustrated in FIGS. 15A and 15B, the cathode power controller 141 may control the discharge power supply so that, in the first rotation mode in which the angle θ of rotation is 0° and 180° (θ=0°, 180°), the power (or the electric power) supplied to the cathode unit performing film deposition takes on a maximum value and thereby the amount f of emissions of sputter particles is the maximum, and so that, in the second rotation mode in which the angle θ of rotation is 90° and 270° (θ=90°, 270°), the power takes on a minimum value and thereby the amount f of emissions of sputter particles is the minimum.

Thus, in the third embodiment, the cathode power controller 141 controls the power supplied to the cathode unit performing film deposition by controlling the discharge power supply 70 so that the supply power for the cathode unit performing film deposition in the first rotation mode is greater than the supply power for the cathode unit performing film deposition in the second rotation mode.

In one embodiment of the present invention, it should be understood that the various changes could be made hereto without departing from the spirit and scope of the invention.

Figure 16:
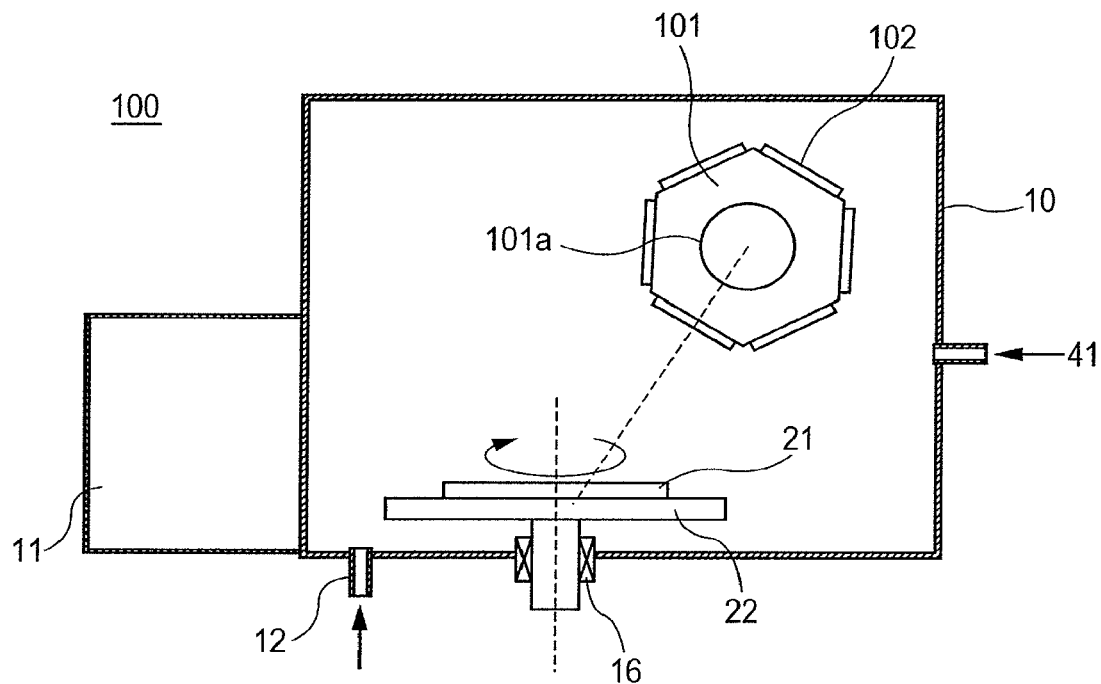
FIG. 16 is a schematic sectional view illustrating in diagrammatic form a sputtering apparatus according to one embodiment of the present invention.

For example, a sputtering apparatus 100 illustrated in FIG. 16 includes a cathode unit 101 in the form of hexagonal prism, in place of the plural cathode units 40 in the sputtering apparatus 1 illustrated in FIG. 1. The cathode unit 101 is configured to be rotatable around a columnar shaft 101a, and a target 102 is placeable on each of side faces of the cathode unit 101. The cathode unit 101 is configured to be capable of applying a voltage individually to the targets 102 placed on the side faces. In such a configuration, the sputtering apparatus 100 can select a desired target by rotating around the columnar shaft 101a. Accordingly, the discharge gas introduction system 41 is moved to a side surface of the vacuum chamber 10 in the vicinity of the cathode unit 101. The sputtering apparatus 100 can deposit a multilayered film on the substrate 21 by sequentially or alternately rotating the cathode unit 101.

Figure 17:
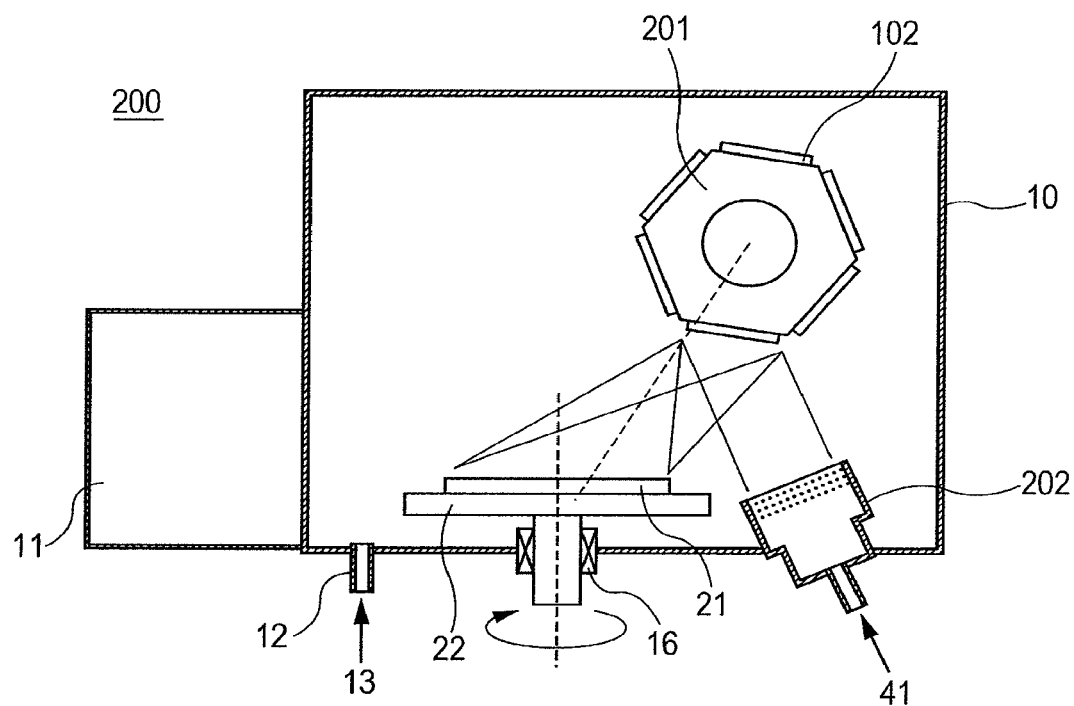
FIG. 17 is a schematic sectional view illustrating in diagrammatic form a sputtering apparatus according to one embodiment of the present invention.
Figure 18:
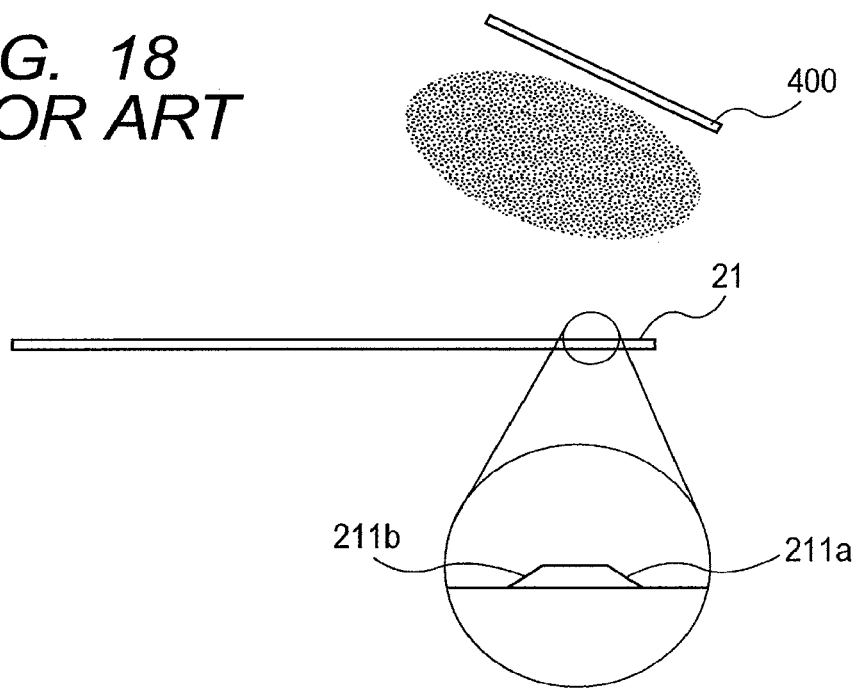
FIG. 18 is a view illustrating in diagrammatic form the relative positions of the relief structure on the substrate and a sputtering target.
Figure 19:
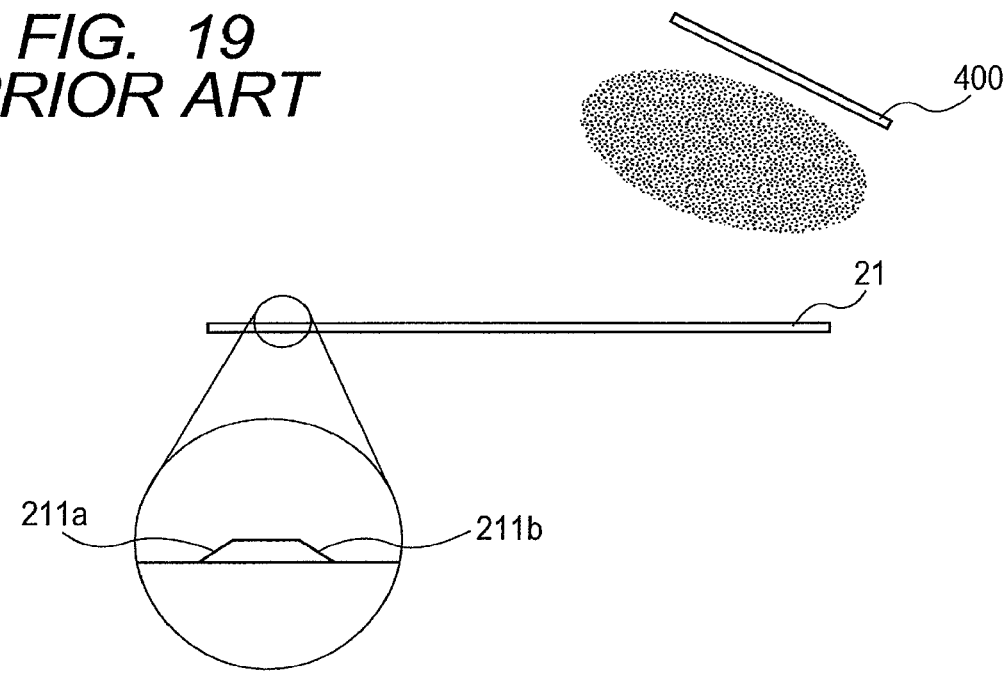
FIG. 19 is a view illustrating in diagrammatic form the relative positions of the relief structure on the substrate and the sputtering target.

Also, a sputtering apparatus illustrated in FIG. 17 includes a target holder 201 having merely a polygonal prism structure, which is obtained by removing a cathode function from the cathode unit 101 in the form of hexagonal prism in the sputtering apparatus 100 illustrated in FIG. 16. Further, the sputtering apparatus illustrated in FIG. 17 eliminates the cathode unit by being provided with the target holder 201, and an ion beam source 202 is arranged instead on a bottom surface of the vacuum chamber 10. An accelerated ion beam from the ion beam source 202 impinges on the target 102 placed on each side face of the target holder 201 in the form of hexagonal prism, thereby to sputter the target surface. Thereby, sputter particles flying out of the target surface are deposited on the substrate 21 on the substrate holder 22. A desired target can be selected by rotating the target holder in the form of hexagonal prism around the columnar shaft. In this case, the discharge gas introduction system 41 is arranged in the ion beam source 202, taking it into account that the discharge gas is introduced into the ion beam source 202. A sputtering apparatus 200 can deposit a multilayered film on the substrate 21 by sequentially or alternately rotating the target holder 201.

Here, the ion beam source 202 is not limited to being arranged on the bottom surface of the vacuum chamber 10 but may be arranged in any location, provided only that the ion beam source 202 is arranged at a position diagonally opposite to the sputtering target (or a sputtering target supporting surface of the target holder 201) and different from the substrate holder 22.

One embodiment of the present invention is applicable in many fields including a magnetic recording medium for HDD, a magnetic sensor, a thin film solar cell, a light emitting element, a piezoelectric element, and patterning for a semiconductor, as well as the magnetic head for HDD given as an example.

Other Embodiments

In one embodiment of the present invention, both the form of control of the rotation speed of the substrate of the first embodiment and the form of control of the supply power for the cathode unit of the second embodiment may be carried out. In this case, the control device 50 is configured to include both the holder rotation controller 51 and the cathode power controller 141.

Also, in one embodiment of the present invention, the control device 50 may be contained in the sputtering apparatus or may be provided separately from the sputtering apparatus through local connection by a LAN (local area network) or the like or connection by a WAN (wide area network) such as the Internet, provided only that the control device 50 can control the rotation driving mechanism for the substrate holder and the discharge power supply included in the sputtering apparatus.

Also, the following processing method may fall within the scope of the above-described embodiments. Specifically, the processing method involves storing in a storage medium a program which brings the configuration of any one of the above-described embodiments into operation so as to implement the function of any one of the above-described embodiments, reading as code the program stored in the storage medium, and executing the program on a computer. In other words, a computer-readable storage medium may also fall within the scope of the examples. Moreover, not only the storage medium storing the above-described computer program but also the computer program in itself may fall within the scope of the above-described embodiments.

A floppy disk (trademark), a hard disk, an optical disk, a magneto-optical disk, CD-ROM (compact disc read only memory), magnetic tape, a nonvolatile memory card, ROM, for example, may be used as such a storage medium.

Moreover, the program stored in the above-described storage medium is not limited to being used singly to execute processing, and the following program may also fall within the scope of the above-described embodiments. Specifically, the program runs on an OS (operating system) in cooperation with other software or the function of an expansion board thereby to execute operations of any one of the above-described embodiments.

The invention claimed is:

1. A film deposition method using sputtering comprising the steps of:
   placing a substrate having a plurality of relief structures, each relief structure having four side surfaces that include two side surfaces parallel to a first direction, formed thereon, on a rotatable substrate holder; and
   forming a film on the two side surfaces of the relief structure by sputtering a sputtering target arranged at a position diagonally opposite to the substrate holder, while rotating the substrate,
   wherein the step of forming includes the steps of:
      detecting a rotational position of the two side surfaces of the relief structure of the substrate held on the substrate holder; and
      adjusting a rotation speed of the substrate according to the detected rotational position, and
   wherein the step of adjusting includes controlling the rotation speed of the substrate so that the rotation speed of the substrate when the sputtering target is located on a side in the first direction which is parallel to the two side surfaces of the relief structure and is parallel to an in-plane direction of the substrate is lower than the rotation speed of the substrate when the sputtering target is located on a side in a second direction which is perpendicular to the first direction and is parallel to the in-plane direction of the substrate.

2. A film deposition method using sputtering comprising the steps of:
   placing a substrate having a plurality of relief structures, each relief structure having four side surfaces that include two side surfaces parallel to a first direction, formed thereon, on a rotatable substrate holder; and
   forming a film on the two side surfaces of the relief structure by sputtering a sputtering target arranged at a position diagonally opposite to the substrate holder, while discontinuously rotating the substrate,
   wherein the step of forming includes the steps of:
      detecting a rotational position of the two side surfaces of the relief structure of the substrate held on the substrate holder; and
      adjusting rotation stop time for the substrate according to the detected rotational position, and
   wherein the step of adjusting includes controlling the rotation stop time for the substrate so that the rotation stop time for the substrate when the sputtering target is located on a side in the first direction which is parallel to the two side surfaces of the relief structure and is parallel to an in-plane direction of the substrate is longer than the rotation stop time for the substrate when the sputtering target is located on a side in a second direction which is perpendicular to the first direction and is parallel to the in-plane direction of the substrate.

3. A film deposition method using sputtering comprising the steps of:
   placing a substrate having a plurality of relief structures, each relief structure having four side surfaces that include two side surfaces parallel to a first direction, formed thereon, on a rotatable substrate holder; and
   forming a film on the two side surfaces of the relief structure by sputtering a sputtering target arranged at a position diagonally opposite to the substrate holder with plasma generated by supplying power to a cathode unit, while rotating the substrate, wherein the step of forming includes the steps of:
    detecting a rotational position of the two side surfaces of the relief structure of the substrate held on the substrate holder; and
    adjusting the power supplied to the cathode according to the detected rotational position, and
wherein the step of adjusting includes adjusting the power supplied to the cathode unit so that the power supplied to the cathode unit when the sputtering target is located on a side in the first direction which is parallel to the two side surfaces of the relief structure and is parallel to an in-plane direction of the substrate is greater than the power supplied to the cathode unit when the sputtering target is located on a side in a second direction which is perpendicular to the first direction and is parallel to the in-plane direction of the substrate.

* * * * *